United States Patent
Patel et al.

(10) Patent No.: US 7,517,141 B2
(45) Date of Patent: Apr. 14, 2009

(54) SIMULTANEOUS CONTROL OF DEPOSITION TIME AND TEMPERATURE OF MULTI-ZONE FURNACES

(75) Inventors: Nital S. Patel, Mesa, AZ (US); Amit M. Rajadhyaksha, McKinney, TX (US); James Boone, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/828,206

(22) Filed: Jul. 25, 2007

(65) Prior Publication Data

US 2008/0025369 A1   Jan. 31, 2008

Related U.S. Application Data

(63) Continuation of application No. 10/838,743, filed on May 4, 2004.

(51) Int. Cl.
*G01N 25/00* (2006.01)
*H01L 21/02* (2006.01)

(52) U.S. Cl. .............................. 374/7; 374/100; 374/45; 438/5; 427/9; 118/715; 118/718

(58) Field of Classification Search ......... 374/170–173, 374/178, 100, 7, 45; 117/14–15; 118/719, 118/666, 663, 714, 715, 730; 219/494, 497; 428/6–13; 427/8–9; 438/6–13, 710, 726–728, 438/730, 732
See application file for complete search history.

(56) References Cited

U.S. PATENT DOCUMENTS

| | | | |
|---|---|---|---|
| 5,270,222 A | * | 12/1993 | Moslehi ..................... 438/7 |
| 5,291,514 A | * | 3/1994 | Heitmann et al. .......... 373/135 |
| 5,436,172 A | * | 7/1995 | Moslehi ..................... 374/121 |
| 5,517,594 A | | 5/1996 | Shah et al. |
| 5,758,121 A | | 5/1998 | Fukuzumi |
| 5,994,675 A | | 11/1999 | Bethune et al. |
| 6,123,766 A | * | 9/2000 | Williams et al. ............ 117/85 |

(Continued)

FOREIGN PATENT DOCUMENTS

JP    2004072022 A    3/2004

(Continued)

OTHER PUBLICATIONS

Grassi, Elena, et al., "PID Controller Tuning by Frequency Loop-Shaping: Application to Diffusion Furnace Temperature Control," IEEE Transactions on Control Systems Technology, vol. 8, No. 5, Sep. 2000, pp. 842-847.

(Continued)

*Primary Examiner*—Gail Verbitsky
(74) *Attorney, Agent, or Firm*—Wade J. Brady, III; Frederick J. Telecky, Jr.

(57) ABSTRACT

The present invention facilitates multi-zone furnace (102) based deposition processes by iteratively adjusting deposition time and zonal setpoint temperatures to mitigate deviations from desired target thickness(es). Coupled feedback loops are employed to update the deposition time (520) and the zonal setpoint temperatures (510) lot to lot and batch to batch while mitigating deviations fro the desired target thickness(es). Error checking is performed by computing an error metric (506) and only updating the setpoint temperatures on the error metric being within an acceptable value (508). Additionally, an excitation parameter (512) is determined that indicates variations in furnace operation.

13 Claims, 8 Drawing Sheets

U.S. PATENT DOCUMENTS

| | | | |
|---|---|---|---|
| 6,176,924 B1* | 1/2001 | Duval et al. | 117/14 |
| 6,211,094 B1 | 4/2001 | Jun et al. | |
| 6,241,822 B1 | 6/2001 | Ide | |
| 6,259,072 B1* | 7/2001 | Kinnard et al. | 219/486 |
| 6,317,662 B1 | 11/2001 | Li et al. | |
| 6,477,450 B2 | 11/2002 | Rodden et al. | |
| 6,559,039 B2* | 5/2003 | Wang et al. | 438/542 |
| 6,622,104 B2 | 9/2003 | Wang et al. | |
| 6,746,908 B2 | 6/2004 | Tanaka et al. | |
| 6,864,466 B2* | 3/2005 | Porter et al. | 219/494 |
| 6,901,317 B2* | 5/2005 | Starner | 700/299 |
| 2002/0045362 A1* | 4/2002 | Yang et al. | 438/791 |
| 2003/0045960 A1* | 3/2003 | Yamamoto et al. | 700/121 |
| 2003/0049372 A1 | 3/2003 | Cook et al. | |
| 2003/0207547 A1* | 11/2003 | Wang et al. | 438/478 |
| 2004/0173599 A1* | 9/2004 | Velichko et al. | 219/494 |
| 2005/0201894 A1* | 9/2005 | Suzuki et al. | 422/62 |
| 2008/0145797 A1* | 6/2008 | Verbeke et al. | 430/322 |

OTHER PUBLICATIONS

He, Qinghua, et al., "Computationally Efficient Modeling of Wafer Temperatures in a Low-Pressure Chemical Vapor Deposition Furnace," IEEE Transactions on Semiconductor Manufacturing, vol. 16, No. 2, May 2003, pp. 342-350.

Sachs, Emanuel, et al., "Run by Run Process Control: Combining SPC and Feedback Control," IEEE Transactions on Semiconductor Manufacturing, vol. 8, No. 1, Feb. 1995, pp. 26-43.

Chong, Robert, et al., "AMD—Modeling LPCVD Furnace Deposition: Effect of the Order in which Equations for Thickness and Across-Furnace Uniformity are Optimized," AEC/APC Symposium XV Poster Session, Sep. 13-18, 2003, 12 pgs.

* cited by examiner

SIMULTANEOUS CONTROL OF DEPOSITION TIME AND TEMPERATURE OF MULTI-ZONE FURNACES

This application is a continuation of application Ser. No. 10/838,743, filed May 4, 2004.

FIELD OF THE INVENTION

The present invention relates generally to semiconductor device fabrication, and more particularly, systems and methods for concurrent control of deposition time and temperature in multi-zone furnaces.

BACKGROUND OF THE INVENTION

Semiconductor device fabrication involves using a number of fabrication processes to build a desired device. Generally, a semiconductor device is fabricated on a semiconductor material referred to as a substrate by forming layers or components, selectively patterning formed layers, and selectively implanting dopants into layers and/or the substrate in order to achieve desired operational characteristics.

A typical process for forming a layer on a semiconductor device involves placing the device in a multi-zone furnace, supplying a deposition source material (a gas), raising the furnace to a selected temperature for a selected period of time, and setting pressure at a suitable value, thereby causing deposition material to deposit on the device thereby forming the desired layer with a selected thickness.

Demand for semiconductor devices results in continuous demands for reduction in device and/or feature sizes as well as reductions in permitted tolerances in formed layers. One known issue with regard to multi-zone furnace deposition processes is that different zones or portions of the furnace can have different temperatures thereby resulting in varied deposition rates, which in turn lead to variations in layer thicknesses. As permitted tolerances continue to shrink, such variations in thicknesses that occur in multi-zone furnace based deposition processes can become unacceptable. Some conventional mechanisms have been employed to provide a tighter control of deposition rate. However, these conventional mechanisms are based on gas flow and the like and can negatively impact the stoichiometry of the devices being fabricated.

What is needed are systems and methods that improve uniformity in layer thicknesses for multi-zone furnace based depositions.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates multi-zone furnace based deposition processes by iteratively adjusting deposition time and zonal setpoint temperatures to mitigate deviations from desired target thickness(es). Coupled feedback loops are employed to update the deposition time and the zonal setpoint temperatures lot to lot and batch to batch while mitigating deviations from the desired target thickness(es). Error checking is performed by computing an error metric and only updating the setpoint temperatures on the error metric being within an acceptable value. Additionally, an excitation parameter is determined that indicates variations in operation of the furnace, which is then employed to alter adjustments to the deposition time.

A system of the present invention includes a multi-zone furnace and a controller. The furnace has multiple temperature zones and a central temperature zone, which is maintained at a nominal temperature during deposition. The furnace includes a number of slots into which wafers are placed. Some of the wafers are monitor wafers that have probes attached and provide thickness measurements during deposition processes. The controller receives the thickness measurements and iteratively updates setpoint temperatures for the multiple temperature zones as well as overall deposition time. The location of the monitor wafers providing the thickness measurements is accounted for. The setpoint temperatures are updated using a developed thermal model and the received thickness measurements. The deposition time is adjusted using the received thickness measurements and the updated setpoint temperatures.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates multi-zone furnace based deposition processes by iteratively adjusting deposition time and zonal setpoint temperatures to mitigate deviations from desired target thickness(es). Coupled feedback loops are employed to update the deposition time and the zonal setpoint temperatures batch to batch while mitigating deviations from the desired target thickness(es). Error checking is performed by computing an error metric and only updating the setpoint temperatures on the error metric being within an acceptable value. Additionally, an excitation parameter is determined that indicates proper or improper operation of the furnace, which is then employed to alter adjustments to the deposition time.

Figure 1:
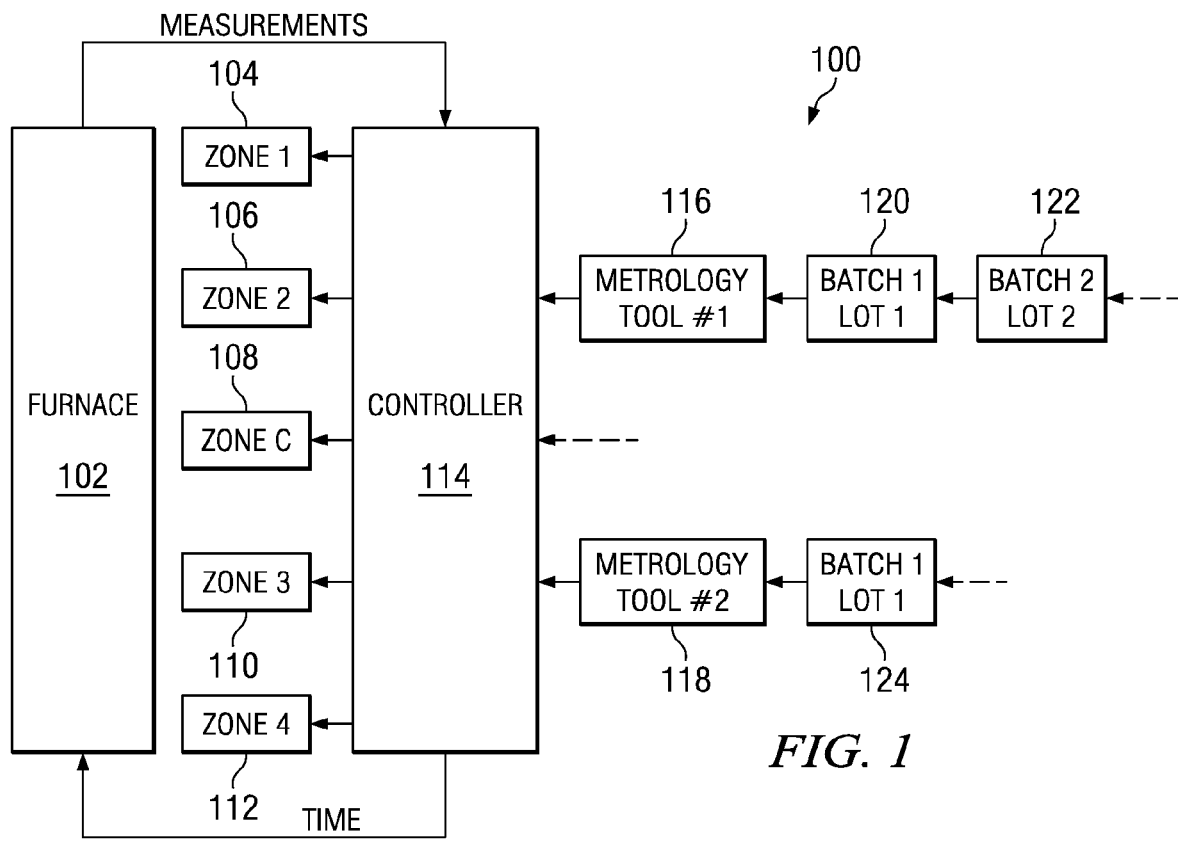
FIG. 1 is a block diagram of a multi-zone furnace deposition system in accordance with an aspect of the present invention.

Turning now to FIG. 1, a block diagram of a multi-zone furnace deposition system 100 in accordance with an aspect of the present invention is illustrated. The system is operative to perform thermal based depositions of materials such as silicon-nitride via a low pressure chemical vapor deposition from dichlorosilane and ammonia. Generally, the system 100 performs a deposition process at a deposition rate influenced by temperature for a specific amount of time to yield a deposited layer with a desired thickness. The system 100 is operable to deposit layers with varied deposition rates (e.g., sidewalls and isolation layers) and/or target thicknesses during a single batch or run of the system 100.

The system 100 includes a furnace 102 in which wafers are placed to undergo deposition, a controller 114 that controls operation of the furnace 102, a first metrology tool 116, and a second metrology tool 118. The furnace 102 has 5 different temperature zones in this aspect, however it is appreciated that other aspects of the invention can have a different number of zones. The zones include a first zone 104 (also referred to as a top zone), a second zone 106, a central zone 108, a third zone 110, and a fourth zone 112 (also referred to as a bottom zone). The central zone 108 is kept at a fixed, nominal temperature during deposition and serves as a reference to decouple the impact of adjustments to deposition time and adjustments to temperature setpoints of the other zones. The first zone 104, the second zone 106, the third zone 110, and the fourth zone 112 are controlled to be heated to independent set point temperatures. The furnace 102 includes a number of slots into which product wafers, monitor wafers, and dummy wafers can be inserted. Typically, the slots of the furnace 102 are filled during deposition processes in order to improve thermal uniformity of the furnace. Generally, the wafers placed in the slots of the furnace are referred to as a batch or run of wafers. Additionally, one or more lots of wafers, defined as wafers having a similar layer deposited, can be present in a single batch.

As stated above, the furnace 102 is controllable with respect to zone temperature setpoints and deposition time. Additionally, other controllable parameters include pressure (e.g., typically at about 0.25 to 2.0 torr for a LPCVD deposition), gas flow, gas partial pressure, and wafer spacing.

Figure 2:
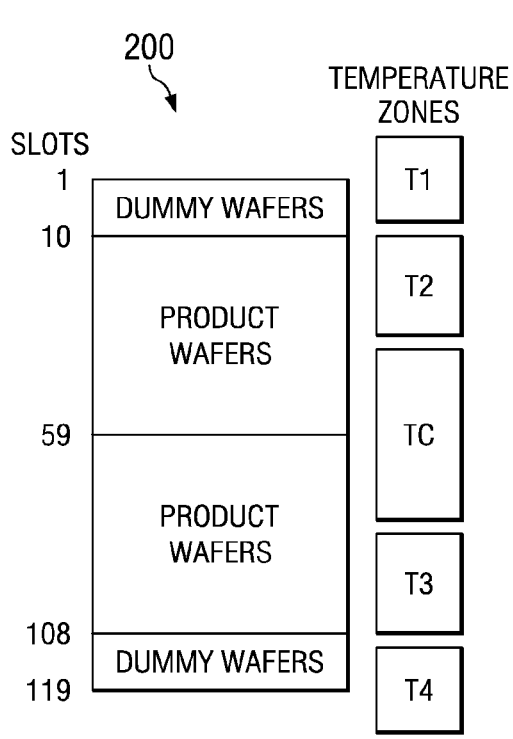
FIG. 2 is a block diagram illustrating exemplary loading and location of wafers in a multi-zone furnace in accordance with an aspect of the present invention.

FIG. 2 is a block diagram illustrating exemplary loading and location of wafers in a multi-zone furnace in accordance with an aspect of the present invention. Here, first dummy wafers are placed in slots 1 to 9, first product wafers are placed in slots 10 through 58, additional product wafers are placed in slots 59 through 107, and additional dummy wafers are placed in slots 108 through 119. The first dummy wafers are also generally located within a temperature zone T1. The first product wafers are generally located within a temperature zone T2 and another temperature zone TC. The second product wafers are located in the temperature zone TC and another temperature zone T3. The second dummy wafers are generally located within a temperature zone T4.

Returning to FIG. 1, the controller 114 controls operation of the furnace 102, as stated above. The controller 114 is operative to supply independent set points to the first zone, 104, the second zone 106, the central zone 108, the third zone 110, and the fourth zone 112 and adjust deposition time in response to temperature and thickness measurement samples.

The first metrology tool 116 identifies processing parameters for a number of batches including batch 1 lot 1 120 and batch 2 lot 2 122. These parameters include desired deposition material, deposition rates, desired deposition thickness, thermal budgets, and the like. The second metrology tool 118 also identifies processing parameters for a number of batches including batch 2 lot 1 124. These parameters include desired deposition material, desired deposition thickness, thermal budgets, and the like.

During operation, a batch of wafers, such as batch 1 lot 1 120 is processed by placing wafers of that batch in the furnace in a suitable manner, such as shown in FIG. 2. An associated metrology tool, such as the first metrology tool 116, provides processing parameters for the current batch to the controller. The controller 114 develops a model of the furnace 102 that simulates thermal behavior through the different temperature zones of the furnace as well as etch rates as a function of temperature. The model is developed based on thickness measurements and resulting deposition rates. The model indicates for a given temperature zone changes in deposition rates according to changes in temperature. Alternately, the controller 114 can employ an existing, previously developed model and contemplates coupling between zones. Subsequently, the controller 114 determines initial set-points for the temperature zones based on the model and the processing parameters and determines and sets values for other controllable parameters including pressure (e.g., typically at about 0.25 to 2.00 torr for a LPCVD deposition), gas flow, gas partial pressure, gas type, and wafer spacing.

As a deposition process proceeds, the controller 114 receives deposition rate (or thickness) measurements and may receive temperature measurement(s) from the furnace 102. Probes located on wafers can be employed to obtain the thickness measurements. Generally, a number of monitor wafers placed in a number of slots are employed to obtain these measurements. The placement of the monitor wafers can be selective in order to facilitate obtaining desired deposition thicknesses. Additionally, variations in actual thicknesses of deposited layers on product wafers can vary. Such variations can be at least partially accounted for by the controller 114. These measurements, also referred to as samples, are then employed by the controller 114 as feedback to determine adjustments, if any, to the temperature zone setpoints and deposition time according to the temperature samples, the developed model, and the processing parameters. The controller 114 also includes a safety feature wherein large adjustments and/or adjustments based on large erroneous measurements and/or sampling error are mitigated by setting limits for temperature samples and time adjustments and temperature setpoint adjustments.

Figure 3:
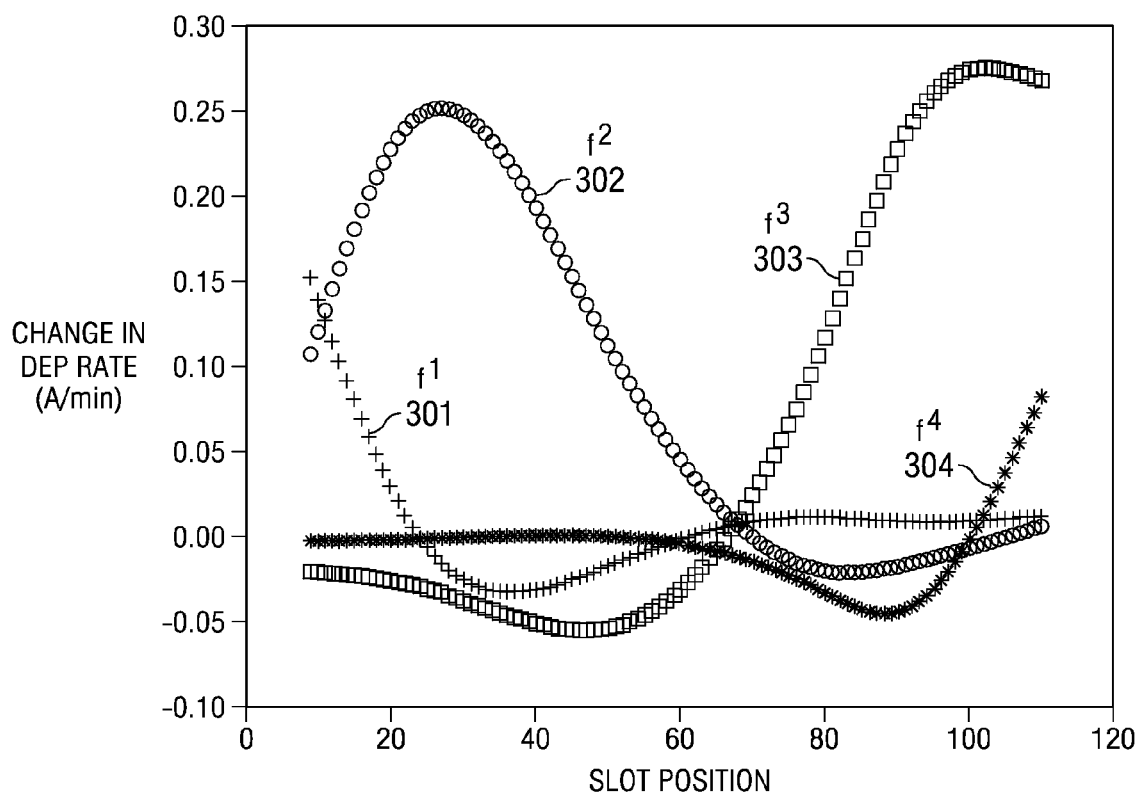
FIG. 3 is a graph of a thermal model illustrating deposition rate versus slot position in accordance with an aspect of the present invention.

FIG. 3 is a graph of a thermal model illustrating deposition rate versus slot position in accordance with an aspect of the present invention. The graph shows slot position on an x-axis and change in deposition rate (Angstroms per minute). The provided graph is exemplary in nature and is provided to illustrate a suitable deposition-thermal response model of the present invention.

The graph illustrates how a change in temperature affects a deposition rate over slot positions in a typical multi-zone furnace. Line 301 illustrates change in deposition rate for a degree change in temperature in a first or top zone across the slot positions 0 to 120, line 302 illustrates change in deposition rate for a degree change in temperature in a second or top central zone across the slot positions 0 to 120, line 303 illustrates change in deposition rate for a degree change in temperature in a third or bottom central zone across the slot positions 0 to 120, and line 304 illustrates change in deposition rate for a degree change in temperature in a fourth or bottom zone across the slot positions 0 to 120. These above lines illustrate coupling between different zones of the furnace. For example, the line 303 shows that earlier slots experience a reduction in deposition rate for a positive degree change in the third temperature zone. In updating temperature (s) and/or deposition times, a controller of the present invention accounts for this coupling between zones.

Figure 4:
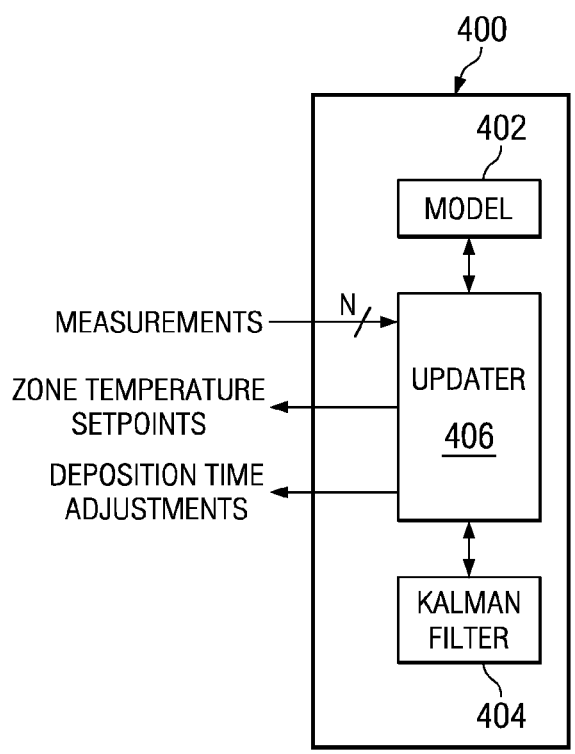
FIG. 4 is a diagram illustrating a furnace controller in accordance with an aspect of the present invention.

FIG. 4 is a diagram illustrating a controller 400 in accordance with an aspect of the present invention. The controller 400 can be employed in the system 100 of FIG. 1 or other similar multi-zone deposition systems in order to update temperature set-points and deposition times based on received temperature samples.

The controller 400 includes a model 402, a Kalman filter 404, and an updater 406. The updater 406 receives a number (N) of thickness measurements from product wafers (not shown) located within a multi-zone furnace (not shown). The thickness measurements are employed to build the model 402, which models deposition rate response per degree temperature change for each zone across slots of the furnace. The number (N) of measurements needed is dependent on the number of parameters being controlled. For example, controlling four temperature zones and deposition time requires at least five measurements. During operation, the updater 406 continues to receive the thickness measurements and employs the model 402 with the thickness measurements to determine zone temperature setpoint adjustments. Additionally, the updater 406 sets parameters and values of the Kalman filter 404 (described in detail infra) and employs the Kalman filter 404, the model 402, the thickness measurements, and the adjusted zone temperature setpoint adjustments to update values associated with the Kalman filter 404 and determine a deposition time adjustment. The updater 406 iteratively adjusts the zone temperature setpoints and the deposition time adjustment during runs and from batch to batch. It is appreciated that alternate aspects of the invention can employ other types of filters for updating and/or adjusting deposition time. Additionally, a suitable Kalman filter is described in detail infra.

Figure 5:
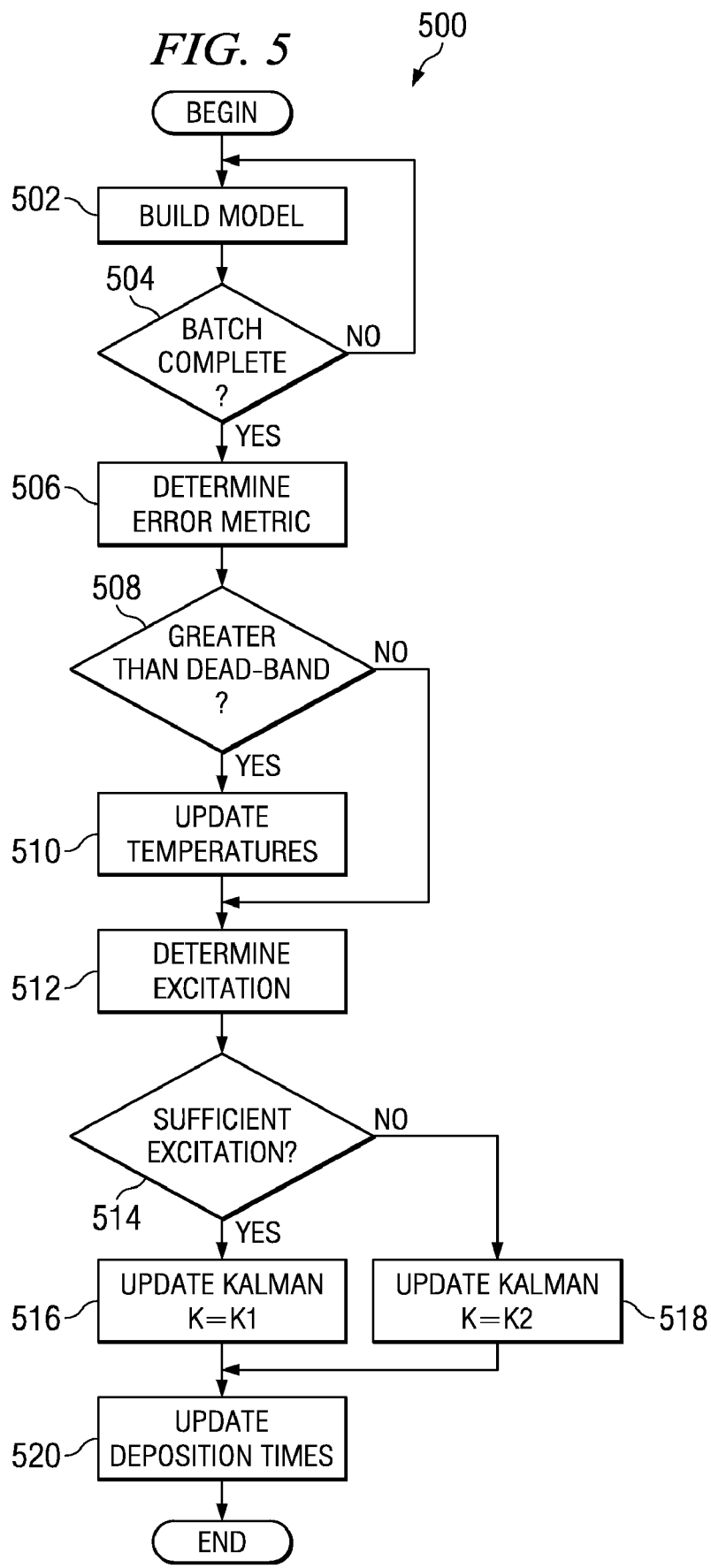
FIG. 5 is a flow diagram illustrating a method of controlling a furnace based deposition process in accordance with an aspect of the present invention.

FIG. 5 is a flow diagram illustrating a method 500 of controlling a furnace based deposition process in accordance with an aspect of the present invention. The method iteratively update temperature zone setpoints and deposition times for the furnace during a run of a batch and also from batch to batch.

The method 500 begins at block 502 where a thermal model is built for a current batch. The model is built from a number of product wafers and thickness measurements obtained for them in various slots located within the furnace. The slots selected for thickness measurements, including location and number, can vary from batch to batch. A determination is made at block 504 as to whether the batch is complete or not (i.e., whether additional thickness measurements remain to be incorporated in the model). If it is not, the method 500 continues to block 502 where the model continues being built. Once the batch is complete and the model built, an error metric is determined at block 506. The error metric represents expected error induced across the furnace load due to measuring a limited number of wafers instead of all wafers, as well as, modeling error present in the thermal model built in block 502. The error metric can vary according to the slots selected to obtain measurements there from. A suitable mechanism for determining the error metric is to utilize the magnitude of the smallest non-zero singular value of the model. Generally, a high value of the error metric indicates less estimated or expected error and a low value indicates more estimated or expected error.

A determination is then made as to whether the error metric is greater than a threshold value referred to as a dead band at block 508. The dead band value is a threshold value and is selected according to allowable expected error and model error. Additionally, the dead band value is selected to ensure that enough information is present to allow updating of temperatures. The dead band value improves stability and to mitigates the impact of subsampling error (i.e., not sampling every slot) on the furnace load. An exemplary value of the dead band value is 0.05, however employed values are implementation dependent.

If the error metric is greater than the dead band value, temperature set-points for one or more of the zones of the furnace are updated at block 510. Typically, a central temperature zone is maintained at a nominal temperature and other temperature zones are adjusted with respect to their setpoints.

The method 500 continues at block 512 wherein an excitation value is determined. The excitation value represents whether enough information is available in the measurements being received to correctly estimate all the parameters the model and is determined by tracking the changes in the processes running on the furnace—in a specific case for example by tracking changes (e.g., in deposition material thickness targets from batch to batch) in the targets being run. A high value of the excitation value indicates that measurements have enough information to update multiple model parameters and a low value indicates that if an attempt is made to update multiple parameters, there is a high likelihood that the updates will be prone to error. If the excitation is sufficient, as determined at block 514, the method proceeds to block 516 where a filter is updated with K=K1. If the excitation is insufficient, the method 500 proceeds to block 518 wherein the filter is updated with K=K2. The K1 is the gain used to update multiple parameters simultaneously; whereas the K2 gives preference to a single parameter as low excitation implies that there is not enough information in the measurements to resolve multiple parameters. Subsequently, a deposition time is determined according to the updated temperatures, measurements, and the Kalman filter and the furnace is updated with the updated deposition time at block 520.

The method 500 can be repeated to provide for updated temperatures and/or deposition times during a deposition process.

The following discussions describe and illustrate, including in mathematical terms, computations and operations performed by the present invention. Methods and systems of the present invention can be employed to perform deposition of silicon nitride from dichlorosilane and ammonia via a low pressure chemical vapor deposition as well as other materials. Such deposited silicon nitride can be employed in a number of instances for semiconductor device fabrication. For example, the depositied silicon nitride can be utilized as a polish stop for shallow trench isolation (such nitride is referred to as isolation nitride and as a spacer for transistor gates, referred to as sidewall nitride. Controlling thickness of deposited films across a furnace load (see FIG. 2 for an example), including silicon nitride, facilitates consistent device performance. A single furnace load, which is wafers loaded into a furnace, can comprise multiple lots and processing conditions should be relatively uniform and within designed parameters to ensure low lot to lot variation. It is noted that batch to batch variations should be mitigated as well as variations within a single batch.

One mechanism for improving uniformity is to alter flow rates of source materials (e.g., ammonia). However, this can impact a deposited layer or films stoichiometry, which in turn affects the performance of subsequent etch process.

The present invention builds a model by using empirical data based on thickness measurements. Typically, monitor and/or product wafers are employed with a single tool to develop a suitable model.

The present invention contemplates a variety of furnaces. However, the following discussion references an exemplary furnace that can be employed for 300 mm wafers, can run up to four 24 wafer lots in a single batch, and has five temperature zones. Each load is comprised of dummy wafers, product wafers, and monitor wafers. Dummy wafers are wafers used to fill up empty slots in a load in order to present a consistent thermal mass and in FIG. 2 are presenting slots 1 through 9 and 109 to 119. Monitor wafers are run and present in order to monitor particles and are present in slots 10, 59, and 108, the last of which can also be used for control purposes. Product wafers are placed in remaining spots. The present invention mitigates deviations from target thicknesses on the product wafers. A controller controls the deposition time for each batch, which can hold up to four 24 wafer lots and temperature setpoints for four different zones, top, top center, bottom center, and bottom zones. The center zone is kept fixed at a nominal deposition temperature and servers as a reference to decouple the impact of deposition time changes, and temperature changes.

The controller performs time and/or temperature control as two independent subproblems. For controlling deposition time, a Kalman filter is employed to simultaneously update processing time for both isolation and sidewall depositions, which are run at different target deposition rates. For temperature control, characterization of controllability of the multi-zone furnace is analyzed and temperature sampling along a number of slots is performed. The controller performs updates iteratively on a lot to lot basis as well as a batch to batch basis.

Generally, a Kalman filter is a set of mathematical equations that provides an efficient computational (recursive) means to estimate the state of a process, in a way that minimizes the mean of the squared error. The filter is powerful in several aspects: it supports estimations of past, present, and even future states, and it can do so even when the precise nature of the modeled system is unknown.

Controlling Deposition Time

The following discussion illustrates, in mathematical terms, one mechanism employed to control deposition time in order to drive deposited layers toward a target thickness. The discussion contemplates that multiple lots can be employed in a single batch and that, therefore, different slots and/or wafers can be driven to different target thicknesses in the same batch.

Let $n \in I_+$ denote the number of furnace slots (excluding those slots occupied by dummies) of interest in the furnace load. Furthermore, any mathematical operation on a matrix or vector by a scalar is assumed to apply term by term.

For the following discussion, the following notations are employed:

$k$ denotes the run number.

$|\cdot|$ denotes the 1-*norm*.

$\|\cdot\|$ denotes the (induced) 2-*norm*.

$\mu(x)$ denotes the average of any vector $x$.

$S \subset I^n \{x \in I^n: x(i) = 0 \text{ or } 1, i = 1, 2, \ldots, n\}$.

$s_k \in S: s_k(i) = 1$ if slot $i$ is measured (sampled).

Else $s_k(i) = 0$. $i = 1, 2, \ldots, n$.

This is referred to as a sampling plan.

$\bar{s}_k \square s_k$ such that $s_k(i) = 1, i = 1, 2, \ldots, n$.

$y_k^{s_k} \in \square^{|s_k|}$: vector of thickness measurements corresponding to $s_k$.

$t_k$: deposition time.

$r_k^{s_k} = y_k^{s_k}/t_k - \mu(y_k^{s_k}/t_k) \in \square^{|s_k|}$ denotes the normalized deposition rate corresponding to sampling plan $s_k$.

$T_k \in \square^4 = [T1\,T2\,T3\,T4]'$.

$I_{(a)} = 1$ if condition $a$ is true, else equals 0.

For any matrix $M \in R^{n \times n}$ let $\rho(M)$ denote its spectral radius. Also, for any matrix $M \in R^{m \times n}$, let $\sigma_i(M), i \geq 1$, denote its $i^{th}$ largest singular value.

The aim of controlling deposition time is to drive the mean thickness of a current batch to a thickness target ($T_k$). Since the process could potentially be running multiple targets, it is useful to express the relationship between the mean thickness and deposition time as:

$$\mu(y_k^{s_k}) = \theta_k(1) + \theta_k(2)t_k + w_k \quad (1)$$

$$= [1 \quad t_k] \begin{bmatrix} \theta_k(1) \\ \theta_k(2) \end{bmatrix} + w_k$$

$$= u_k \theta_k + w_k$$

where $w_k \in \square$ is assumed to be zero mean i.i.d. distributed with cov(w)=R. Eq. (1) is a linear stochastic difference equation that estimates the mean thickness. $\theta_k(1)$ is referred to as a pattern offset and $\theta_k(2)$ is a deposition rate. The term $w_k$ represents process, assumed to be random white noise. Furthermore, it is assumed that:

$$\theta_{k+1} = \theta_k + v_k, E(\theta_0) = \bar{\theta}$$

where $v_k \in R^2$ is zero mean i.i.d. (independent, identically distributed random variables) with cov(v)=Q, and is independent of $w_k$; and $E(\cdot)$ denotes the expectation operator. The term $v_k$ is measurement noise, $\theta_k$ is a vector of furnace parameters (e.g., thickness measurements, deposition rate, and the like) from (1) for a current batch and $\theta_{k+1}$ represents a vector of furnace parameters for a next batch. Let $\Sigma_0 = \text{var}(\theta_0) + Q$. As a result, the Kalman filter recursions can be expressed as:

$$\Sigma_{k-1} = \Sigma_k - \Sigma_k u_k (u_k \Sigma_k u_k + R)^{-1} u_k \Sigma_k + Q \quad (2)$$

$$K_k = \Sigma_k u_k (u_k \Sigma_k u_k + R)^{-1}$$

$$\hat{\theta}_{k+1} = \hat{\theta}_k + K_k (\mu(y_k^{s_k}) - u_k \hat{\theta}_k), \hat{\theta}_0 = \bar{\theta}$$

where $\hat{\theta}_k$ denotes the estimate of the actual parameter $\bar{\theta}_k$. The above equation (2) yields the minimum variance estimate of $\theta_k$, i.e., one that minimizes $$E[(\theta_k - \hat{\theta}_k)(\theta_k - \hat{\theta}_k)'].$$

Then at the start of any run k, given the target for the run ($\Gamma_k$), one can compute the deposition time by inverting the model (1) as follows:

$$t_k = \frac{\Gamma_k - \hat{\theta}_k(1)}{\hat{\theta}_k(2)}. \quad (3)$$

It is noted that there exists a tendency in fabrication to dedicate a tool for running material at a specific process step (e.g., at isolation nitride deposition). This is done in order to simplify inventory management and scheduling. The control mechanism of the present invention monitors for sufficient excitation of the Kalman filter, which is a measure of whether enough information is available from the measurements to reliably compute both parameters in $\hat{\theta}_k$. This can be accomplished by tracking the batch-to-batch variation in the thickness target(s) ($\Gamma_k$). The Kalman filter can be turned off if sufficient variation in the process mix as indicated by changes in the targets of the batches being run is not detected, and revert to updating the model via integral control. In order to do this consider $$\xi_{k+1} = (1 - \varepsilon_\xi)\xi_k + \varepsilon_\xi \delta(\Gamma_k - \Gamma_{k-1}, \Delta\Gamma), \xi_0 = 1 \quad (4)$$

where $$\delta(a, b) \square \begin{cases} 1 & \text{if } |a| \geq b, \\ 0 & \text{else.} \end{cases}$$

Thus, if batch to batch (or lot to lot) variation in thickness target $|\Gamma_k - \Gamma_{k-1}|$ is less than a threshold amount $\Delta\Gamma$ the term $\delta(\Gamma_k - \Gamma_{k-1}, \Delta\Gamma)$ is equal to zero, which effectively "switches off" the Kalman filter within a limited number of batches.

Then, given $\tau_\xi$, such that $0 < \tau_\xi < 1$, and $\epsilon_\theta$, with $0 < \epsilon_{74} < 2$, the gain $K_k$ in Eq. (2), above, can be modified as follows:

$$K_k = \begin{cases} \sum_k u_k \left( u_k \sum_k u_k + R \right)^{-1} & \text{if } \xi_k \geq \tau_\xi, \\ \begin{bmatrix} 0 \\ \varepsilon_\theta / t_k \end{bmatrix} & \text{else.} \end{cases}$$

$\tau_\xi$ and $\epsilon_\theta$ represent threshold values for switching between the two gain values in the above equation and a filter factor for tracking the excitation, respectively. Combining (2) and (4) obtains the following recursion for tracking the parameters in (1) for determining deposition time.

$$\Sigma_{k+1} = \Sigma_k - I_{(\xi_k \geq \tau_\xi)} \cdot (\Sigma_k u_k (u_k \Sigma_k u_k + R)^{-1} u_k \Sigma_k - Q)$$

$$K_k = I \cdot \Sigma_k u_k (u_k \Sigma_k u_k + R)^{-1} + I_{(\xi_k < \tau_\xi)} \cdot [0_{\epsilon_\theta / \tau_k}]$$

$$\xi_{k+1} = (1 - \epsilon_\xi)\xi_k + \epsilon_\xi \delta(\Gamma_k - \Gamma_{k-1}, \Delta\Gamma)$$

$$\hat{\theta}_{k+1} = \hat{\theta}_k + K_k (\mu[y_k^{s_k}] - u_k \hat{\theta}_k) \quad (5)$$

Eq. (5) can then be employed by a controller of the present invention to determine deposition time for each run and to adjust the deposition time during runs of the batch by measuring deposition rates at one or more product wafers within a batch and using the measured values for $\theta_k$.

Modification to the above recursion to account for coupling between temperature and rate is discussed below.

Control of Cross-Load Variation

Cross-load variation is a variation in temperature across wafers present in a furnace for a single batch. As stated previously, wafers of a batch are loaded into a number of slots of a furnace, one wafer per slot. These cross-load variations can impact and alter deposition rates and, therefore, resulting thicknesses of deposited layers. Cross-load variation is controlled or mitigated by controlling temperature setpoints (T) of zones present within a furnace. This problem is posed as minimizing at any given run k the following:

$$e_k^{\bar{s}} = \|r_k^{\bar{s}} - \mu(r_k^{\bar{s}})\|$$

where the entire furnace load is assumed to be sampled (i.e., $s = \bar{s}$) and the term $r_k^{\bar{s}}$ represents measured temperatures. As a result, the above can be rewritten as minimizing:

$$e_k^{\bar{s}} = \|(I_{|\bar{s}|} - 1_{|\bar{s}|}/|\bar{s}|)\square r_k^{\bar{s}}\|$$

where the multiplier $I_{|\bar{s}|} - 1_{|\bar{s}|}/|\bar{s}|$ is singular. As a result, instead of solving the above equation, terms can be removed leaving the simplified equation below.

$$e_k^{\bar{s}} = \|r_k^{\bar{s}}\| \text{ with } r_{k-1}^{\bar{s}} \text{ assumed to be 0 mean.}$$

Let $e_{k,opt}^{\bar{s}}$ denote the minimum value of this error.

Generally, it is not practical to measure every wafer in the furnace load. Typically, only a subset of wafers in a furnace are measured (i.e., $|s|<|\bar{s}|$). Using such a subset results in a non-optimal rate profile across the furnace load referred to as subsampling error. Additionally, in this example, there are four temperatures to be determined and these temperatures can be solved from four temperature and/or thickness measurements, referred to as a sampling plan. A suitable sampling plan (s*) should satisfy $$s^* \in \arg\min_{\{s \in S: |s|=4\}} \|e^s - e_{k,opt}^{\bar{s}}\| \quad (6)$$

as well as to characterize this error. However, in practice, non-optimal sampling plans can be employed that do not meet the restrictions of Eq. (6), above. Such non-optimality is induced not only by production sampling constraints, but also due to the need to simultaneously control deposition time, in addition, to the four temperatures, which requires at least five measurements to resolve the five unknowns. In this case, it is of interest to also characterize the penalty in terms of the error in comparison to the optimal error obtained by considering all the slots (i.e., via $\bar{s}$). In order to address these issues, behavior of the furnace to changes in temperature (T) can be investigated.

Temperature Response

The following discussion is an example of characterizing a temperature response of a furnace and is provided for illustrative purposes. For this example, a sequence of furnace runs is carried out with monitor wafers distributed across the furnace load, and with dummy wafers occupying the remaining slots in order to characterize the relationship between the deposition rate and temperature. Product wafers are not employed due to their high cost. Furthermore, all the runs are on a single tool only. Given the time involved in a single run (typically about 6 hours), only one side (positive) of the nominal temperature profile is explored.

Table 1 shows the conditions considered.

TABLE 1

Sequence of one-sided temperature tests.

| Case | $T_1$ | $T_2$ | $T_C$ | $T_3$ | $T_4$ |
|---|---|---|---|---|---|
| 1 | 0 | 0 | 0 | 0 | 0 |
| 2 | + | 0 | 0 | 0 | 0 |
| 3 | + | + | 0 | 0 | 0 |
| 4 | 0 | + | 0 | 0 | 0 |
| 5 | + | 0 | 0 | 0 | + |
| 6 | 0 | + | 0 | + | 0 |
| 7 | 0 | 0 | 0 | + | + |
| 8 | 0 | 0 | 0 | + | 0 |
| 9 | 0 | 0 | 0 | 0 | + |

For this example, there are five temperature zones $T_1$, $T_2$, $T_C$, $T_3$, and $T_4$, from one end of a furnace to another. In table 1, a "0" entry denotes that the zone was set to the nominal process temperature $T_C$, and a "+" entry denotes that the zone was set to a temperature equal to $T_C+5°$ C. It is assumed that the response to temperature is locally linear, and a negative ($T_C-5°$ C.) change would induce an opposite effect to that observed in the cases considered in Table 1. Generally, large changes in temperature are not expected under run-to-run control, hence the response can be assumed to be locally linear. Furthermore, any local nonlinearity can be treated as modeling error whose effect can be made to vanish under the effect of feedback. Stability issues pertaining to such approximation are discussed infra.

Figure 6:
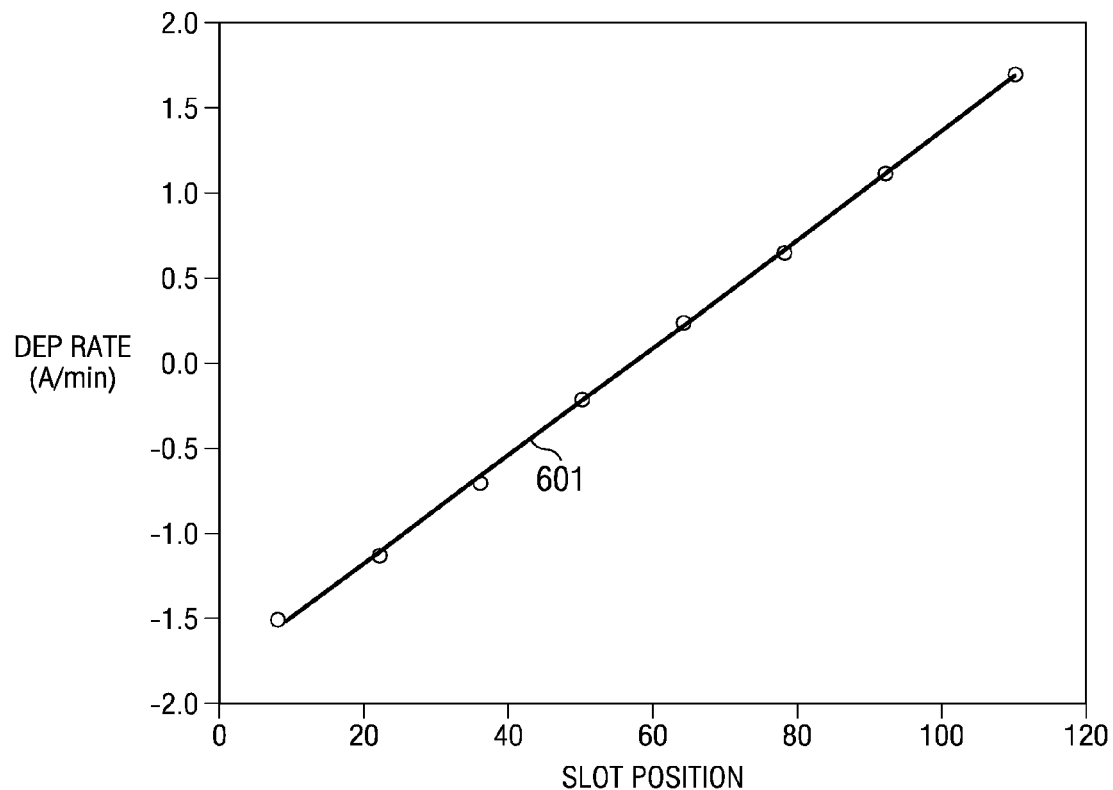
FIG. 6 is a graph illustrating deposition rate response across a furnace load in accordance with an aspect of the present invention.

FIG. 6 is a graph illustrating a measured deposition rate response across a furnace load in accordance with an aspect of the present invention. The graph is provided as an example to further illustrate the present invention. The deposition rate measured is as a deviation from a mean deposition rate across the furnace load (represented by slot positions) for the case where all temperature zones are fixed at the nominal setpoint value ($T_C$) The deposition rate is illustrated by the y-axis and a slot position, from 0 to 120, is represented by the x-axis. Circles 601 show measured thickness along with a linear fit. Accordingly, FIG. 6 depicts a linear rate increase in deposition rate deviation across the furnace load in this example.

Figure 7:
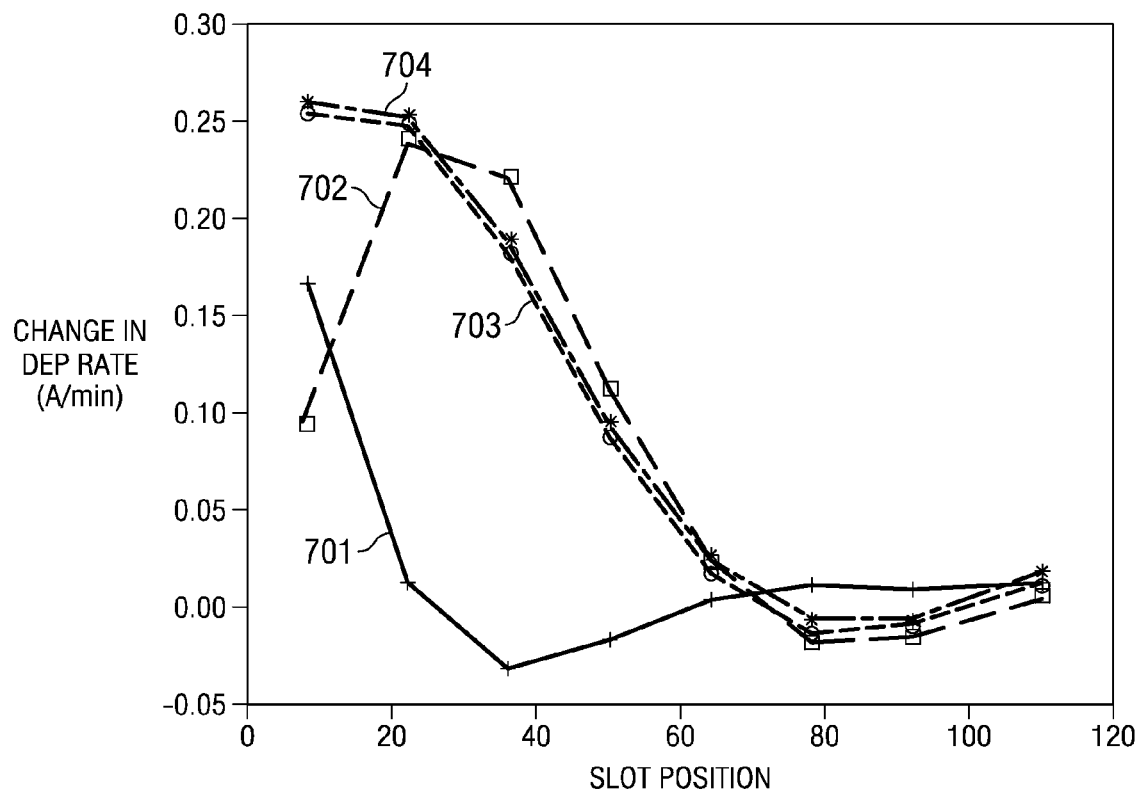
FIG. 7 is a graph illustrating deviation in deposition rate induced by temperature setpoint variations in accordance with an aspect of the present invention.

FIG. 7 is a graph illustrating deviation in deposition rate induced by temperature setpoint variation for cases 2, 3, and 4 in Table 1 in accordance with an aspect of the present invention. The deposition rate is illustrated by a y-axis and a slot position, from 0 to 120, is represented by an x-axis. Here the deviation in deposition rate for each case is calculated as a difference in the observed rate profile as compared to the nominal case, i.e., case 1.

Rate profile as deviation from nominal profile for setpoint changes is shown. Line 701 (+) illustrates a change in deposition rate response for case 2, line 702 (□) illustrates a change in deposition rate response for case 3, line 703 (○) illustrates a change in deposition rate response for case 4, and line 704 (*) illustrates a change in deposition rate for a sum of cases 2 and 4. The responses have been scaled to correspond to that for a 1° C. change.

As observed from the figure, the response to case 3 line 703, which combines the setpoint changes from cases 2 and 4, appears to behave as the sum of the individual responses from cases 2 and 4 at the line 704. This is seen to hold well for other zonal combinations as well.

It is noted that error induced by assuming an additive zonal response can be ignored if temperature changes are expected to be relatively small. It is assumed that less than a degree Celsius of change occurs because the equations are employed iteratively by the controller. The impact of this assumption on stability will be discussed further below.

Figure 8:
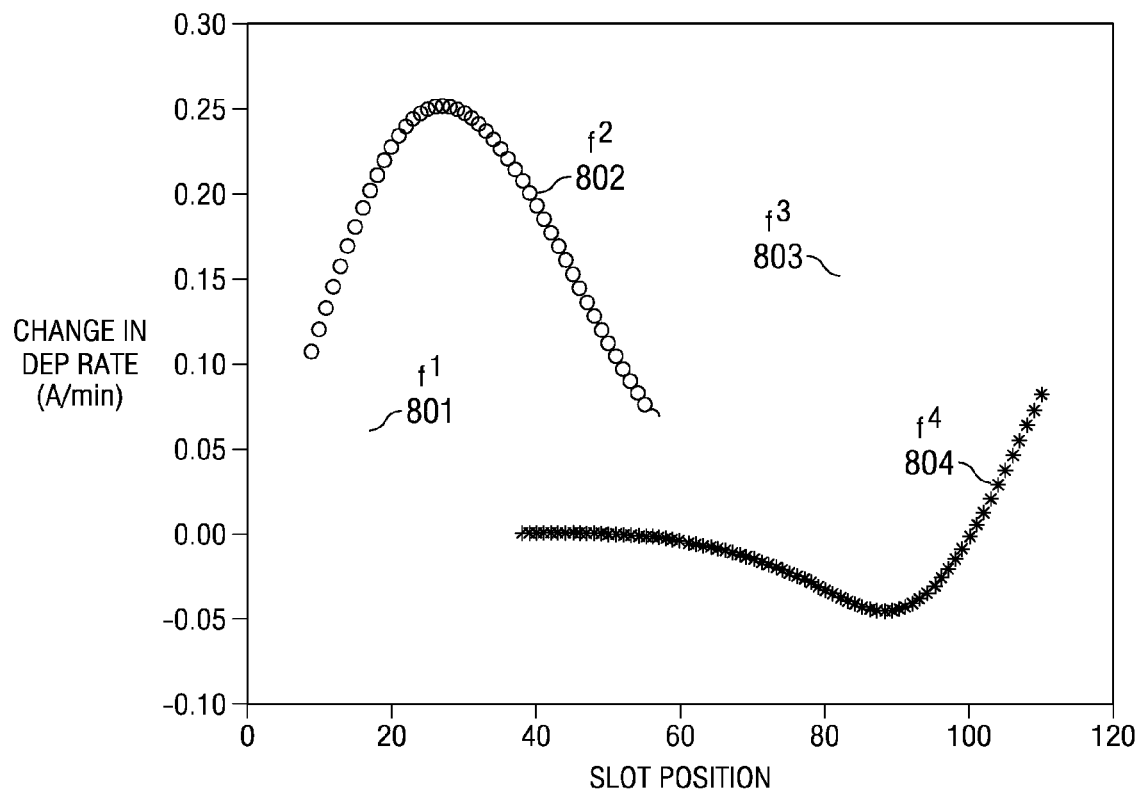
FIG. 8 is a graph of a thermal model illustrating deposition rate versus slot position in accordance with an aspect of the present invention.

FIG. 8 is a graph of a thermal model illustrating deposition rate versus slot position in accordance with an aspect of the present invention. The graph shows slot position on an x-axis and change in deposition rate (Angstroms per minute). The provided graph is exemplary in nature and is provided to illustrate a suitable deposition-thermal response model of the present invention.

The graph illustrates how a change in temperature affects a deposition rate over slot positions in a typical multi-zone furnace. Line 801 illustrates change in deposition rate for a degree change in temperature in a first or top zone across the slot positions 0 to 120, line 802 illustrates change in deposition rate for a degree change in temperature in a second or top central zone across the slot positions 0 to 120, line 803 illustrates change in deposition rate for a degree change in temperature in a third or bottom central zone across the slot positions 0 to 120, and line 804 illustrates change in deposition rate for a degree change in temperature in a fourth or bottom zone across the slot positions 0 to 120. These above lines illustrate coupling between different zones of the furnace. For example, the line 803 shows that earlier slots experience a reduction in deposition rate for a positive degree change in the third temperature zone. In updating temperature (s) and/or deposition times, a controller of the present invention accounts for this coupling between zones.

The individual zonal responses are shown in FIG. 8, where $f^i \in R^{|s|}, i=1,2,3,4$ denotes the rate profile across the furnace load for a degree change in the setpoint for zone i.

Under the additive zonal response assumption, the impact of temperature change ($\Delta T$) can be expressed as a linear model:

$$\Delta r^{\bar{s}} = F^{\bar{s}} \Delta T \qquad (7)$$

where $\Delta r^{\bar{s}} = r_{new}^{\bar{s}} - r_{old}^{\bar{s}}$, $\Delta T = T_{new} - T_{old}$, and $F^{\bar{s}} \in \square^{|\bar{s}| \times 4}$ is defined as follows $$F^{\bar{s}} = [f^1 f^2 f^3 f^4]$$

where $f^i(x)$ is the impact of zone i on slots x as shown in FIG. 8 and $F^{\bar{s}}$ is a vector of zonal responses for a furnace. Significant interaction can be seen amongst the zones. For example, considering $f^3$, an increase in $T_3$ increases the rate in the lower half of the furnace, but it also causes the rate in the upper half of the furnace to drop. This should be considered in control operation in order to avoid an oscillating control response, as indicated in FIG. 8.

In practice, each of the response curves in FIG. 8 can be modeled via a piece-wise cubic spline fit. For example, $$f^{-1}(x) = (14.8 - 1.14(x - 8) + 0.0081(x - 8)^3) \cdot I_{(x<22)} +$$
$$(1.12 - 0.66(x - 22) + 0.034(x - 22)^2 - 0.00052(x - 22)^3) \cdot$$
$$I_{(22 \leq x < 36)} -$$
$$(2.89 + 0.015(x - 36) - 0.012(x - 36)^2 + 0.00035(x - 36)^3) \cdot$$
$$I_{(36 \leq x < 50)} -$$
$$(1.54 - 0.15(x - 50) + 0.00046(x - 50)^2 + 0.000066(x - 50)^3) \cdot$$
$$I_{(50 \leq x < 64)} +$$
$$(0.27 + 0.097(x - 64) - 0.0032(x - 64)^2 - 0.0000043(x - 64)^3) \cdot$$
$$I_{(64 \leq x < 78)} +$$
$$(0.99 + 0.0042(x - 78) - 0.0034(x - 78)^2 + 0.00014(x - 78)^3) \cdot$$
$$I_{(78 \leq x < 92)} + (0.75 - 0.011(x - 92) - 0.000042(x - 92)^3) \cdot I_{(92 \leq x)}.$$

$f^2$, $f^3$, and $f^4$ are defined similarly.

It is noted that for any general slot sample s, with $|s| < |\bar{s}|$, let $F^s \in \square^{|s| \times 4}$ denote a matrix constructed by considering only those rows of $F^{\bar{s}}$, i.e. $F^{\bar{s}}(i,:)$ that correspond to s(i) = 1.

Characterization of Furnace Controllability

The following discussion illustrates a characterization of the inherent controllability of a cross-furnace rate profile via zonal temperature as appreciated by the inventor of the present invention. The following discussion focuses on control of temperature. Also controlling deposition time induces non-optimality in temperature control, especially when the furnace load is sampled, i.e. not all furnace slots of interest are measured. Given only four temperatures to manipulate, one will not, in general, be able to match the deposition rates across all wafers. This discussion attempts to capture this information in terms of an attenuation gain, which can be potentially used to compare the response of different furnaces.

Motivated by FIG. 6, assume that the initial rate response with all zones set to nominal temperature ($T_C$) is zero mean linear, i.e.

$$r_0^{\bar{s}} \in \square^{\bar{s}}, \text{ s.t. } r_0^{\bar{s}}(i) = \alpha(i - i_0), \text{ with } \sum_{i=1}^{|\bar{s}|} r_0^{\bar{s}}(i) = 0, \alpha > 0.$$

For future use, define for any $s \in S$, $$F^{s\dagger} \in \square^{4 \times |s|}, \text{ s.t. } F^{s\dagger} = (F^{s'} F^s)^{-1} F^{s'},$$

where it is assumed that for any $s \in S$ considered, $F^s$ has full column rank and represents a zonal response of a furnace for less than all of the slots. This assumption will always be satisfied for any $s \in S$ for which temperature updates will be made via stability constraints described infra. As a result, the optimal temperature change ($\Delta T^*$) that minimizes $$\|r_0^{\bar{s}} + F^{\bar{s}} \Delta T\|$$

is given by $$\Delta T^* = -F^{\bar{s}\dagger} r_0^{\bar{s}}. \qquad (8)$$

Given this, the new rate profile $\hat{r}^{\bar{e}, \hat{o} \bar{v} \bar{s} \bar{s}}$ is (via Eq. (7))

$$\hat{r}^{\bar{s}} = r_0^{\bar{s}} + F^{\bar{s}} \Delta T^*$$
$$= (I_{|\bar{s}|} - F^{\bar{s}} F^{\bar{s}\dagger}) r_0^{\bar{s}}.$$

Let $L^{|\bar{s}|}$ denote the space of zero mean linear rate profiles. Then define $\gamma_{opt} > 0$ as $$\gamma_{opt} \sup_{r_0^{\bar{s}} \in L^{|\bar{s}|}} \frac{\|\hat{r}^{\bar{s}}\|}{\|r_0^{\bar{s}}\|} = \frac{\|(I_{|\bar{s}|} - F^{\bar{s}} F^{\bar{s}\dagger}) r_0^{\bar{s}}\|}{\|r_0^{\bar{s}}\|} \qquad (9)$$

for any $r_0^{\bar{s}} \in L^{|\bar{s}|}$, s.t. $r_0^{\bar{s}} \neq 0$. $\gamma_{opt}$ is thus the optimal attenuation gain for any initial zero-mean linear rate profile. Furthermore, let $\tilde{r}^{\bar{s}}$ be any zero-mean nonlinear rate profile. Then one has $$\|\hat{r}^{\bar{s}}\| = \|(I_{|\bar{s}|} - F^{\bar{s}} F^{\bar{s}\dagger}) \tilde{r}^{\bar{s}}\|$$
$$= \|(I_{(\bar{s})} - F^{\bar{s}} F^{\bar{s}\dagger})(\tilde{r}^{\bar{s}} - r_0^{\bar{s}} + r_0^{\bar{s}})\| \text{ for any } r_0^{\bar{s}} \in L^{|\bar{s}|}, \{0\} \leq$$
$$\|(I_{|\bar{s}|} - F^{\bar{s}} F^{\bar{s}\dagger}) r_0^{\bar{s}}\| + \|I_{|\bar{s}|} - F^{\bar{s}} F^{\bar{s}\dagger}\| \|\tilde{r}^{\bar{s}} - r_0^{\bar{s}}\| \leq$$
$$\gamma_{opt} \|r_0^{\bar{s}}\| + \|\tilde{r}^{\bar{s}} - r_0^{\bar{s}}\|.$$

Pick $r_1^{\bar{s}}$ as the best linear approximation of $\tilde{r}^{\bar{s}}$. Note that since $\tilde{r}^{\bar{s}}$ is zero-mean, it implies that $r_1^{\bar{s}} \in L^{|\bar{s}|}$. Then one obtains:

$$\frac{\|\hat{r}^{\bar{s}}\|}{\|\tilde{r}^{\bar{s}}\|} \leq \gamma_{opt} \frac{\|r_1^{\bar{s}}\|}{\|\tilde{r}^{\bar{s}}\|} + \sqrt{1 - R^2}$$

where $R^2$ is the fit error in approximating $\tilde{r}^{\bar{s}}$ by $r_1^{\bar{s}}$.

Figure 9:
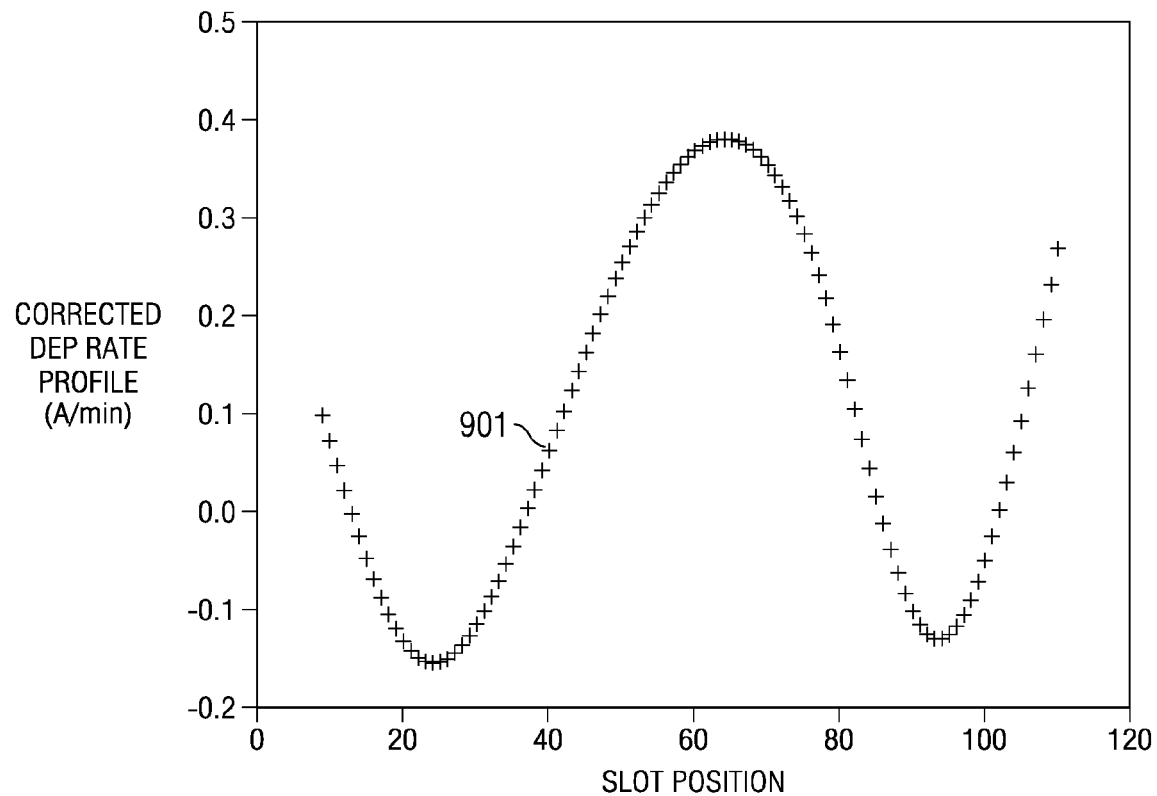
FIG. 9 is a graph illustrating an optimal corrected profile obtained in accordance with an aspect of the present invention.

FIG. 9 is a graph illustrating an optimal corrected profile obtained from the furnace characteristics shown in FIG. 6 and FIG. 8. in accordance with an aspect of the present invention. An x-axis represents slot position from 0 to 120 and a y-axis represents corrected deposition rate profile. Profile 901 yields an attenuation gain $\gamma_{opt} = 0.1863$. It is noted that, in general, this will not be a flat profile, and $\gamma_{opt}$ can be used to compare the amount of control afforded by different furnaces.

Impact of Sampling

In the above discussion, it has been assumed that all positions in the furnace are measured, and these obtained measurements are available for adjusting the zonal temperatures. In practice, it is generally feasible to measure a limited number of wafers (e.g., one wafer per lot). This practice of sampling a limited number of wafers induces errors in estimating the temperature setpoint changes, and causes the rate profile across the furnace load to deviate from the optimal profile (such as the profile 901 shown in FIG. 9). The following discussion characterizes the errors induced by sub-sampling the furnace load as appreciated by the inventor of the present invention. Once again, a zero-mean linear profile is used and the resultant attenuation gain characterized in terms of the optimal attenuation gain $\gamma_{opt}$.

Let s, with $|s|<|\bar{s}|$ denote the sampling plan. Let $r_0^{\bar{s}}$ denote the initial zero-mean linear profile, and let $r_0^s$ denote this profile sub-sampled according to s. Let $\hat{r}^{\bar{s}}$ denote the optimal corrected profile. As a result, the following equation is obtained:

$$\hat{r}^s = r_0^s + F^s \Delta T^* \quad (10)$$

where $\Delta T^*$ is the temperature profile from Eq. (8). Let $r^s$ denote the optimal corrected profile obtained by considering $r_0^s$, and let $\Delta T^s$ be the temperature profile, as defined by this equation:

$$\Delta T^s \in \arg\min_{\Delta T \in R^4} \|r_0^s F^s \Delta T\|. \quad (11)$$

Then $$r^s = r_0^s + F^s \Delta T^s.$$

From the above, the following is obtained $$\hat{r}^s - r^s = F^s(\Delta T^* - \Delta T^s) \quad (12)$$

As a result, the below equation is obtained $$r^s = r_0^s + F^s \Delta T^s$$
$$= \hat{r}^s + F^s(\Delta T^s - \Delta T^*)$$
$$= \hat{r}^s + F^s F^{s\dagger}(\hat{r}^s - r^s)$$
$$= \hat{r}^s + F^s F^{s\dagger} \hat{r}^s.$$

The last result following from the fact that $r^s$ is in the null space of $F^{s'}$. Which implies that the attenuation gain ($\gamma_s$) for the sampled case is bounded as follows:

$$\gamma_s := \frac{\|r^s\|}{\|r_0^s\|} \le \gamma_{opt} + \frac{\|F^s F^{s\dagger} \hat{r}^s\|}{\|r_0^s\|}. \quad (13)$$

Let $\beta(s)$ denote the optimal residual attenuation factor, i.e.

$$\beta(s) = \frac{\|\hat{r}^s\|}{\|r_0^s\|} \le \gamma_{opt}$$

and noting that this is independent of $r_0^{\bar{s}}$ (in fact $\gamma_{opt} = \beta(\bar{s})$), one can rewrite (13) as $$\gamma_s \le \gamma_{opt} + \sigma_1(F^s F^{s\dagger}) \beta(s)$$

Based on Eq. (13), the location of the four optimal samples (s*) can be determined as follows (here, time compensation is ignored)

$$s^* \in \underset{|s|=4}{\arg\min}\{\beta(s)\}. \quad (14)$$

Figure 10:
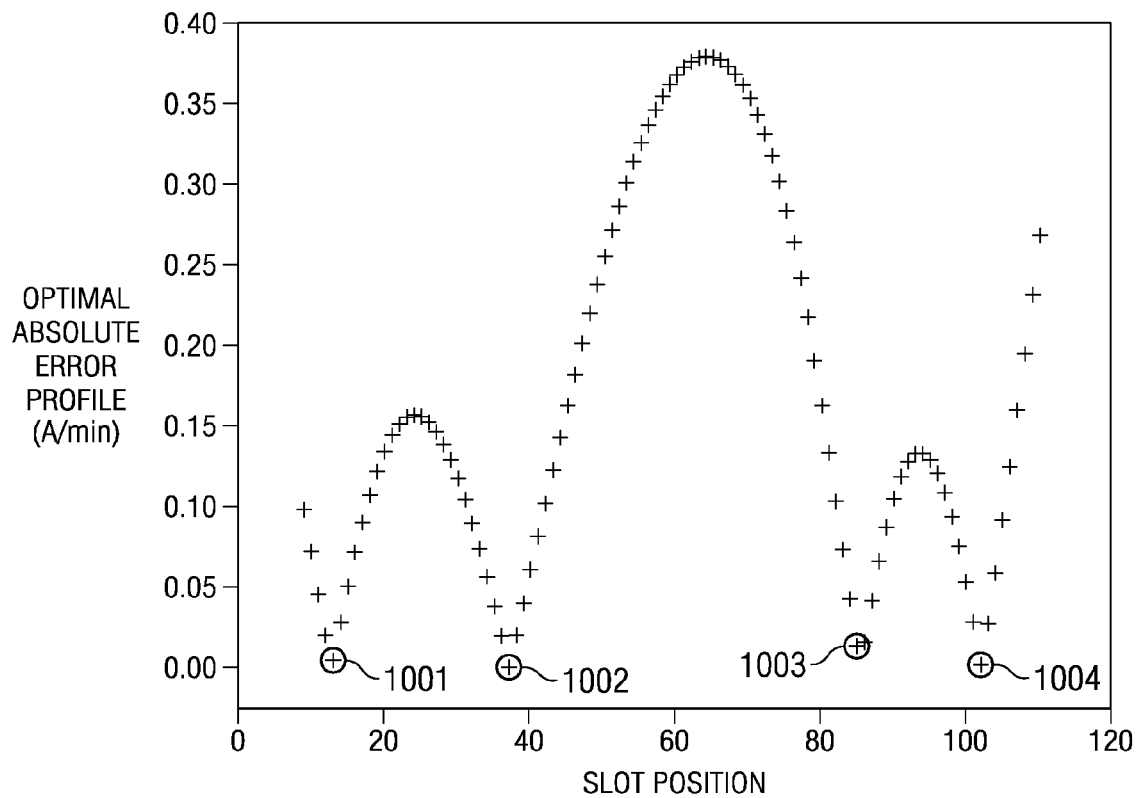
FIG. 10 is a graph illustrating suitable sample selection for monitoring temperatures in a multi-zone furnace in accordance with an aspect of the present invention.

The four optimal samples (s*) can be obtained by looking at a plot of the absolute value of the optimal response ($\hat{r}^{\bar{s}}$), such as shown in FIG. 10, and picking the slots corresponding to the four smallest values.

Figure 11:
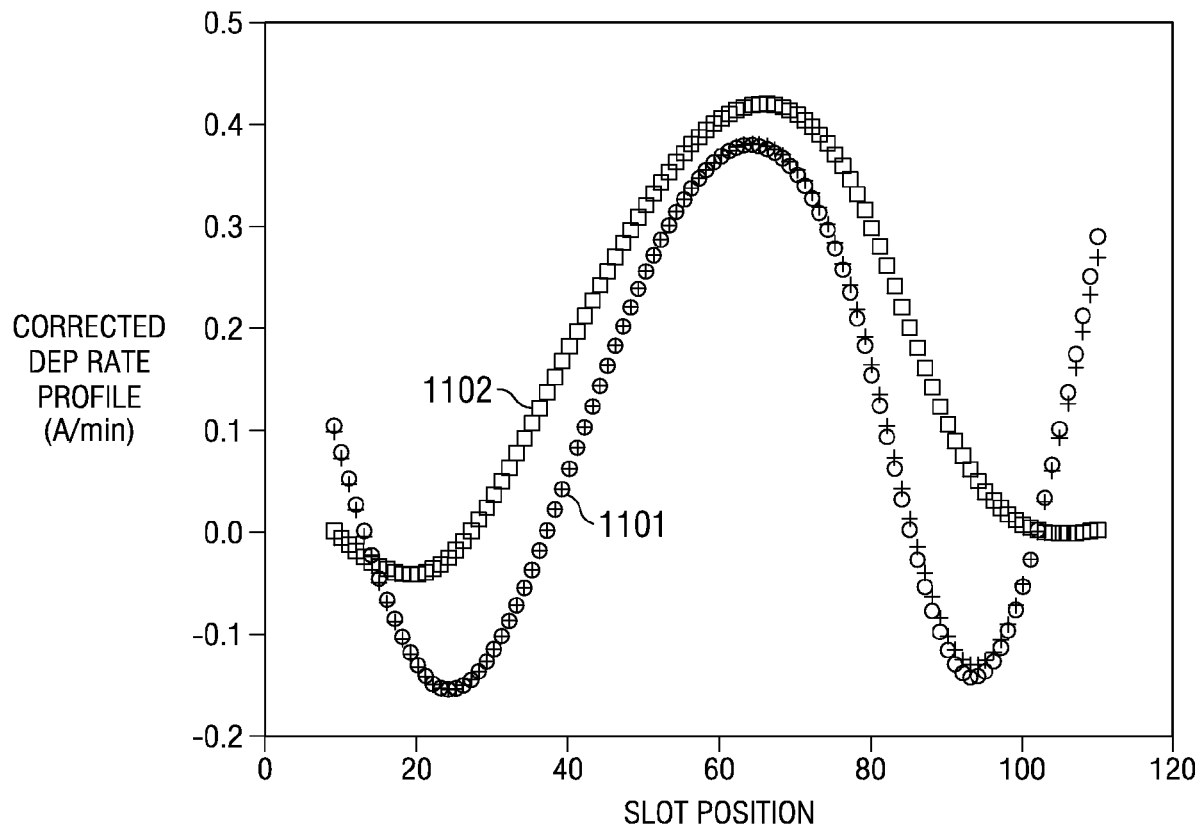
FIG. 11 is a graph illustrating a comparison between optimal and non-optimal sampling in accordance with an aspect of the present invention.

FIG. 10 is a graph illustrating suitable sample selection for monitoring temperatures in a multi-zone furnace in accordance with an aspect of the present invention. An x-axis represents slot positions from 0 to 120 and a y-axis depicts optimal absolute error profile in Angstroms per minute. In FIG. 10, there are four relative minimum selection points corresponding to slot 13 (1001), slot 37 (1002), slot 85 (1003), and slot 102 (1004). This is in contrast to the slots corresponding to the maxima of the temperature responses (denoted as $s_{max}$) in FIG. 8, which correspond to slots 9, 27, 102, and 110. FIG. 11 is a graph illustrating a comparison between error from optimal sampling (s*) and error induced by picking the slots corresponding $s_{max}$ in accordance with an aspect of the present invention. An x-axis represents slot position from 0 to 120 and a y-axis depicts corrected deposition rate profile in Angstroms per minute. The attenuation factors for these cases are: (note that $\gamma_{opt}=0.1863$)) $\gamma_{s^*}=0.1864$ (optimum), and $\gamma_{s_{max}}=0.2159$ and result in corresponding curves 1101 based on optimum sampling and 1102 based on $s_{max}$ sampling. It is appreciated by the inventor of the present invention that even though $r_0^{\bar{s}}$ is zero-mean, the corrected rate profile in non-zero mean with $\mu(r^s)=\mu(F^s \Delta T^s)$. This induces coupling between the temperature and time loops. In fact, even though the profile derived from $s_{max}$ exhibits less peak to peak variation than the optimal profile, it shows a significant shift in the mean rate. This will result in large changes in deposition time, which will repeat from run-to-run (i.e., each iteration). To smoothen out the rate profile using $s_{max}$ samples (the line 1102) will cause a large shift in deposition rate, which is undesirable for deposition time control.

Note that an alternate bound for $\gamma_s$ can be derived as follows:

$$\gamma_s \le \gamma_{opt} + \frac{\|F^s F^{s\dagger} \hat{r}^s\|}{\|r_0^s\|} \le$$
$$\gamma_{opt} + \|F^s F^{s\dagger}\| \gamma_{opt} \le$$
$$(1 + \sigma_1(F^s)\sigma_1(F^{s\dagger}))\gamma_{opt} \le$$
$$\left(1 + \frac{\sigma_1(F^s)}{\sigma_4(F^s)}\right)\gamma_{opt}.$$

Temperature Control and Stability to Modeling Errors

The following discussion presents a closed-loop control scheme that can be employed by a controller of the present invention. The following discussion also analyzes bounds on allowable modeling errors. The latter is important as in practice it is extremely time consuming and costly to run characterization experiments on all the furnaces. Furthermore, wafer substrate differences between the monitors used for deriving the temperature response model, and product wafers at isolation and sidewall nitride deposition will cause the temperature response models to deviate from those derived above. Such deviation can be due to differences in nucleation rates, as well as, changes in wafer surface area, and thermal mass.

First consider the feedback control scheme. At run k, let $s_k$ denote the sampling plan (in order to control temperature only, one needs $|s_k| \geq 4$, and for time and temperature, $|s_k| \geq 5$), $T_k$ the 4 temperature setpoints, $r_k^{s_k}$ the zero-mean rate profile. Then the rate profile model can be expressed as $$r_k^{s_k} = \alpha_k^{s_k} + F^{s_k}(T_k - T_C) + \eta_k^{s_k}$$

where $\alpha_k^{s_k} \in \square^{|s_k|}$ is the disturbance input, and $\eta_k^{s_k} \in \square^{|s|}$ is the sampled disturbance (generated from an i.i.d. distributed random variable $\eta_k \in \square^{|s|}$. $s_k$ can be treated as a random variable, and in order to study stability, it is assumed that the sampling plan is fixed, i.e. $s_k = s = \mu(s_k)$. The impact of this assumption will be assumed to result in an additional component to the measurement noise, and given the independence of the variables to the sampling plan, the rate profile model can be written as $$r_k^s = \alpha_k^s + F^s(T_k - T_C) + \tilde{\eta}_k^s \quad (15)$$

where $\tilde{\eta}_k^s$ now comprehends the additional noise induced by variations in the sampling plan. The controller can now be derived as follows. Let $\tilde{\alpha}_k^s$ denote the estimate of disturbance input $\alpha_k^s$ at run k. Then given the observations ($\{T_k, r_k^s\}$) at run k, the estimate of $\alpha_k^s$ at run k+1 can be obtained via an exponentially weighted moving average (EWMA) algorithm, where given $0 < \lambda < 2$, one has $$\hat{\alpha}_{k-1}^s = (1-\lambda)\hat{\alpha}_k^s + \lambda(r_k^s - F^s(T - T_C)). \quad (16)$$

Furthermore, given $\hat{\alpha}_k^s$ at run k, the temperature setpoint settings are obtained as $$T_k = -F^{s\dagger}\hat{\alpha}_k^s + T_C. \quad (17)$$

The above equations can be combined to yield an integral controller for determining setpoint temperature adjustments as follows:

$$-F^{s\dagger}\hat{\alpha}_{k+1}^s = -(1-\lambda)F^{s\dagger}\hat{\alpha}_k^s - \lambda F^{s\dagger}r_k^s + \lambda(T_k - T_C)$$

which using (17) yields $$T_{l+1} - T_C = (1-\lambda)(T_k - T_C) - \lambda F^{s\dagger}r_k^s + \lambda(T_k - T_C) \quad (18)$$
$$= T_k - T_C - \lambda F^{s\dagger}r_k^s$$

which finally gives $$T_{k+1} = T_k - \lambda F^{s\dagger}r_k^s$$

In practice, large values of $\lambda$ are not desirable due to the possibility of instability due to modeling errors. To characterize the impact of these errors, assume that the true furnace response is given by $\overline{F}^s$, and assume this can be expressed as $\overline{F}^s = F^s + E^s$, where $E^s$ denotes the modeling error.

Figure 12:
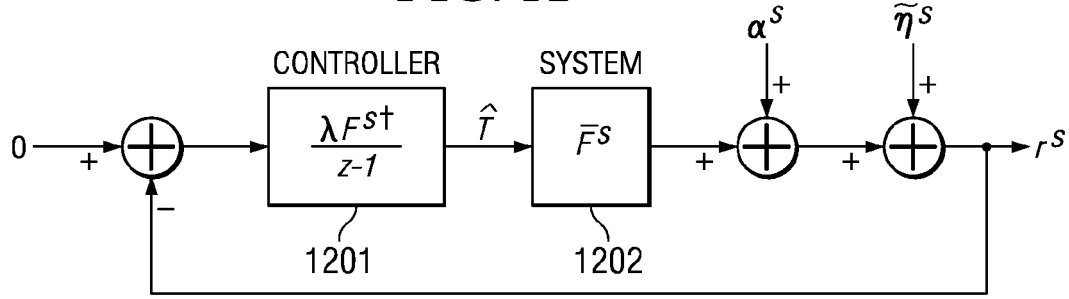
FIG. 12 is a diagram illustrating a closed loop control scheme in accordance with an aspect of the present invention.

FIG. 12 is a diagram illustrating a closed loop control scheme 1200 for determining setpoint adjustments in accordance with an aspect of the present invention. The term $\hat{T} = T - T_C$ illustrates deviation from a central temperature zone $T_C$. A controller 1201 inputs values in the form normalized deposition rate $r^s$, disturbance input $\alpha^s$, and sampled disturbance $\overline{\eta}^s$ and, based thereon, generates temperature setpoint adjustments $\hat{T}$, which are provided the a multi-zone furnace system 1202 that alter setpoint temperatures of one or more zones of the multi-zone furnace system 1202 while maintaining a setpoint temperature of the central temperature zone at a nominal value. The input values are computed from temperature sample measurements $s_k$.

FIG. 12 illustrates the feedback loop described by Eq. 18 and depicts measured rate deviations from the mean rate that are compared to 0 and fed back into the controller. From this, the controller 1201 sends an updated temperature setpoint vector $\hat{T}$ to the furnace. The setpoint temperatures of the one or more zones are typically not at $T_C$. Additionally, observations/measurements are subject to measurement noise, represented by the term $\overline{\eta}^s$, the sampled disturbance. As a result, the inherent rate profile $\alpha^s$ (which is the rate profile in the furnace when all zones are at $T_C$ (as shown, for example in FIG. 6)) is not known and is treated as a disturbance input.

From FIG. 12, in order to ensure stability, the following is true:

$$\det\left(I_{|s|} + \frac{\lambda \overline{F}^s F^{s\dagger}}{z-1}\right) \neq 0, \text{ for all } |z| > 1.$$

This implies that $$\det(zI_{|s|} - (I_{|s|} - \lambda \overline{F}^s F^{s\dagger})) \neq 0 \text{ for all } |z| > 1.$$

Which in turn holds if $$\rho(I_{|s|} - \lambda \overline{F}^s F^{s\dagger}) \leq 1 \quad (19)$$

or $$0 \leq \{eig(\lambda(F^s + E^s)F^{s\dagger})\} \leq 2$$

or $$\lambda \sigma_1(E^s F^{s\dagger}) \leq \min\{\lambda, 2-\lambda\}$$

or $$\sigma_1(E^s) \leq \min\left\{1, \frac{2-\lambda}{\lambda}\right\} \frac{1}{\sigma_1(F^{s\dagger})} = \min\left\{1, \frac{2-\lambda}{\lambda}\right\} \sigma_4(F^s).$$

Eq. (19) also shows the importance of picking a sampling plan that yields a sufficiently high $\sigma_4(F^s)$. Compare this to the above discussion, which indicates that in order to keep the error induced due to sampling small, a sampling plan should be picked with a large $\sigma_4(F^s)$. Both of these conditions indicate that it is important to pick a sampling plan that yields a bounded $\sigma_4(F^s)$ i.e. $\sigma_4(F^s) > k_{min}$, where $k_{min} > 0$ is a predefined limit. This ensures adaptability to and mitigation of modeling errors, as well as, minimizes the error induced by sampling. It is also noted that stability is maintained as 1 is an eigenvalue of $(I_{|s|} - \lambda \overline{F}^s F^{s\dagger})$ for any s (measurement samples) such that $|s| > 4$.

Iterative Implementation

The following discussion combines time adjustments and temperature adjustments into an iterative controller scheme that mitigates undesired deposition rate variations. The scheme is presented to track and update off batch data. The scheme is iterative in order to monitor and track product lots in any batch within the controller. For illustrative purposes, some details are omitted in order to keep the presentation clear, such as, for example, those dealing with batch tracking, mis-sequenced batches, measurement delays, and numerical tests on matrix conditioning, amongst others. As noted above, a non-optimal sampling plan for optimizing temperatures may be employed instead of an optimal sampling plan. For example, there are five setpoints (four temperatures, and deposition time) to track in the present example, five measurements from five slots of the furnace are required. This, however, causes the sampling plan to deviate from the minimal optimal plan s*. The fifth slot should ideally be selected to be the least sensitive one to temperature changes. This is obtained by finding the slot corresponding to the minimal norm row of $F^s$. For the furnace response considered so far this corresponds to slot 67. Once again in practice this exact selection may not be possible.

As noted in the previous discussion, the mean of the deposition rate after temperature adjustment is in general non-zero and is given by $\mu(F^s \Delta T^s)$. This rate correction needs to be applied to the Kalman filter Eq. (5). Let N be the total number of expected measurements from a batch (e.g., if a single wafer per lot is measured then N would be number of lots). Given these N measurements, the rate profile is approximated as being zero-mean by transforming the measured rates to deviation from their mean. Product wafers are measured on a lot-by-lot basis (vs. being batched). This forces two levels of updates, one from lot-to-lot (i); and the other from batch-to-batch (k). Let $s_i$ denote the slot number for measurement i. Also, let $$f(s_i) = \begin{bmatrix} f^1(s_i) \\ f^2(s_i) \\ f^3(s_i) \\ f^4(s_i) \end{bmatrix}.$$

Now consider the following feedback algorithm, which can be employed by methods and/or systems of the present invention to control deposition time and temperature:

let i:=0; FI(0):=$0_{4 \times 4}$; FY:=$0_{4 \times 1}$; $\Xi_F(0)$:=$0_{4 \times 1}$; $\bar{r}(0)$:=0.

while (i<N) do $FI(i+1) := FI(i) + f(s_i)f'(s_i).$ $FY(i+1) := FY(i) + y_k(s_i)f(s_i)/t_k.$ $\Xi_F(i+1) := \Xi_F(i) + f(s_i).$ $\bar{r}(i+1) := \dfrac{i\bar{r}(i) + y_k(s_i)/t_k}{i+1}.$ $i := i+1.$ if $(i = N)$ $T_{k+1} := T_k;\ \Delta T_k := 0.$ if $(N \geq 5)$ Compute $\sigma_4(FI(N))$. //error metric if$(\sigma_4(FI(N)) > \kappa_{min}^2)$//if metric greater than deadband $T_{k+1} := T_k - \lambda FI^{-1}(N)(FY(N) - \Xi_F(N)\bar{r}(N)).$
$\Delta T_k := -\lambda FI^{-1}(N)(FY(N) - \Xi_F(N)\bar{r}(N)).$ //update temp setpoints endif endif Update $\sum$, K, and $\xi$ via Eq. (5). Update $\hat{\theta}$ via (Eq. 5 updates Kalman filter and excitation)

-continued $\hat{\theta}_{k+1} :=$ $\hat{\theta}_k + K_k((\bar{r}(N) + \Xi'_F(N)\Delta T_k/N)t_k - u_k\theta_k).$//update deposition times endif endwhile Note that in the iterative scheme above, the update for $\hat{\theta}$ has been modified to include a correction term which represents $\mu(F^s \Delta T^s)$. Furthermore, the temperature update involves transforming the observed rates to offsets from their mean value. In order to simplify the computation, the singular value check on $F^s$ has been replaced by a check on the singular value of $(F^{s'} F^s)$, where the latter is the square of the former (and hence the test is done against $k_{min}^2$, which is used to ensure that the model is sufficient to overcome mismatch in actual furnace behavior, as well as, mitigating the impact of furnace subsampling on the cross-load error.

The update scheme presented in this section sidelines issues related to outlier detection, measurement delays, mis-sequenced measurements, maintenance events (e.g., furnace liner changes), updates on qualification runs, and monitoring of controllers to prevent mis-process. This has been done to keep the overall presentation as clear as possible. Modifications need to be made to the update scheme to address these issues prior to implementation in production.

Production Example

The following discussion describes a production example in which time and temperature control is applied to multiple furnaces running sidewall nitride and isolation nitride deposition in high-volume production. For purposes of control, the same temperature response model (as derived for FIG. 8) is used across all furnaces for both the isolation and sidewall nitride processes. The furnaces are vertical furnaces with five temperature zones and are capable of running four production lots at a time, and the thickness measurements are obtained via interferometery. Data is transferred to and from the tools to a factory host where all control computations are performed. Updated time and temperature setpoints are downloaded at the start of a batch. Each furnace is capable of holding four 24 wafer product lots per batch. A single wafer from each lot is measured with respect to deposition rate after deposition. In order to generate 5 samples per batch, the monitor in the highest slot is always measured. Due to deposition rate differences between monitor and product wafers, a correlation offset is used to convert the monitor thickness into an equivalent product thickness.

Figure 13:
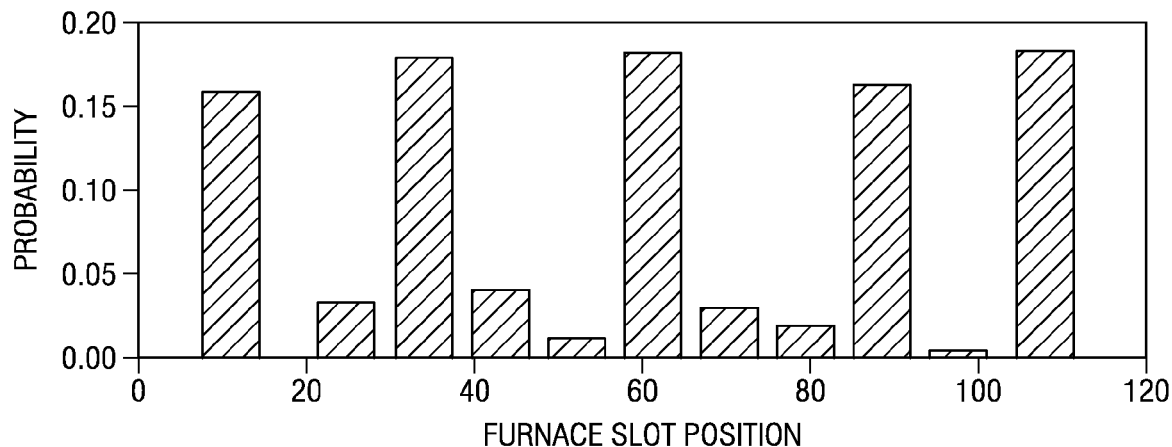
FIG. 13 is a histogram illustrating distribution of probability of sampling specific slots across the furnace per lot in accordance with an aspect of the present invention.

FIG. 13 is a histogram illustrating distribution of probability of sampling specific slots across the furnace per lot in accordance with an aspect of the present invention. An x-axis represents furnace slot position ranging from 0 to 120 and a y-axis represents probability of sampling. The histogram is obtained by observing location of the product wafers measured while the furnace is running production. The samples with the greatest probability correspond to slots 12, 36, 61, 85, and 108, where the last slot is that of the monitor wafer. The attenuation gain corresponding to these slots is calculated (with respect to a zero mean linear profile) as $\gamma_s$=0.1935 which places it close to the optimal value ($\gamma_{opt}$=0.1863) obtained when all product wafers in the load are assumed to be sampled. Furthermore, for these slots $\sigma_4(F^s)$=0.066.

Figure 14:
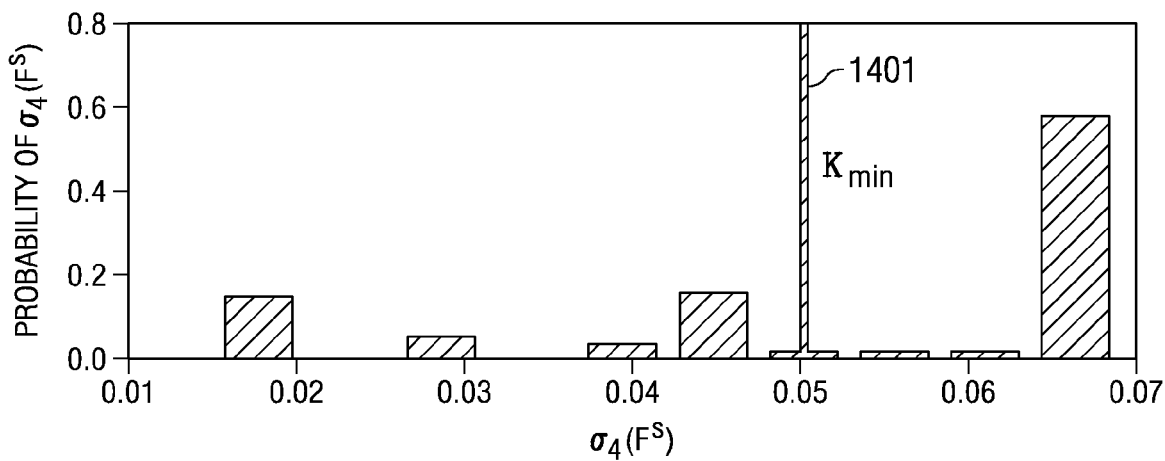
FIG. 14 is a histogram illustrating distribution of an error metric across the furnace per lot in accordance with an aspect of the present invention.

FIG. 14 is a histogram illustrating distribution of $\sigma_4(F^s)$ (an error metric) based on the sampling distribution shown in FIG. 13 in accordance with an aspect of the present invention.

An x-axis represents furnace slot position ranging from 0 to 120 and a y-axis represents a probability of $\sigma_4(F^s)$. A suitable threshold or dead zone value is obtained at $K_{min}$=0.05 at 1401. For any $\lambda \leqq 1$ in (16), this gives $\sigma_1(E^s)$<0.05 via (19) which corresponds to a 15% allowable variation in the model (as measured by $\sigma_1(E^s)/\sigma_1(F^s)$ for the most probable slot sampling from FIG. 14). Since the production slots measured are not predetermined, the threshold test on $\sigma_4(F^s)$ prevents the models from updating if $\sigma_4(F^s)$ is too small for that specific batch. It is of interest to note that such a choice also excludes the sampling plan $S_{max}$ (see FIG. 11), which results in large shifts in mean deposition rate. This is done to ensure there is always sufficient margin (19) to guarantee stable convergence of temperatures, while also making sure (via (13)) that the error induced due to sampling is limited. By ensuring sufficient margin, the same temperature response model can be employed across processes involving different substrate conditions (which impact deposition rate), and also across multiple process tools.

Figure 15:
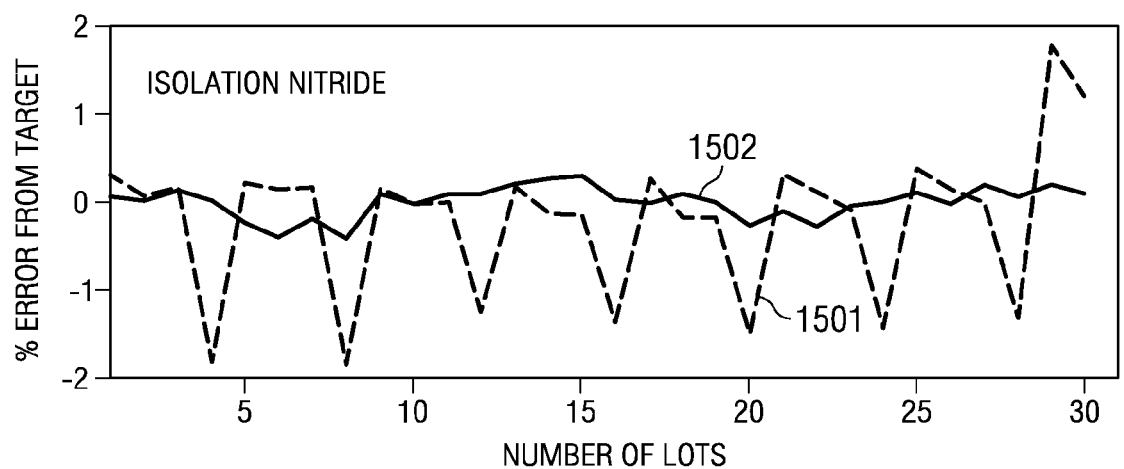
FIG. 15 is a graph illustrating deviation from expected target thicknesses for deposited isolation nitride in accordance with an aspect of the present invention.
Figure 16:
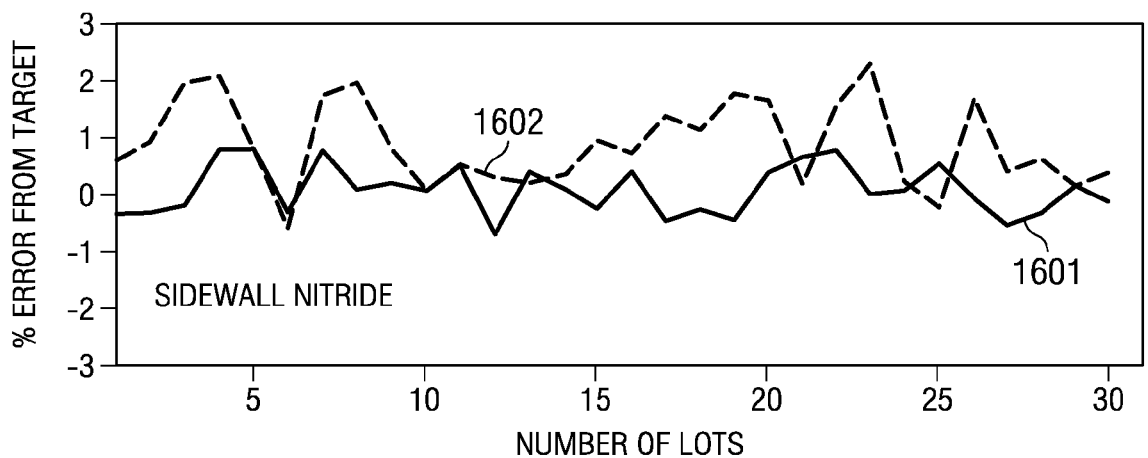
FIG. 16 is a graph illustrating deviation from expected targets for deposited sidewall nitride in accordance with an aspect of the present invention.

FIGS. 15 and 16 show the result of applying the control scheme at isolation and sidewall nitride processes. FIG. 15 is a graph illustrating deviation from expected target thicknesses for deposited isolation nitride in accordance with an aspect of the present invention. An x-axis depicts numbers of lots and a y-axis depicts percent error from target deposition thicknesses. Line 1501 illustrates process performance with iterative temperature and time control of the present invention and line 1502 is without the iterative temperature and time control. It can be seen that the line 1501 shows substantially less deviation from target thicknesses than does the line 1502. FIG. 16 is a graph illustrating deviation from expected targets for deposited sidewall nitride in accordance with an aspect of the present invention. Again, an x-axis depicts numbers of lots and a y-axis depicts percent error from target deposition thicknesses. Line 1602 illustrates process performance with iterative temperature and time control of the present invention and line 1601 is without the iterative temperature and time control. It can be seen that the line 1602 shows substantially less deviation from target thicknesses than does the line 1601. The sidewall nitride shows greater variability as a percent of target, not just because the deposited film is thinner, but also due to device pattern induced metrology noise. Performance improvements as measured by the root-mean-square (rms) of the percent error are as follows: The rms percent error for isolation nitride drops from 0.86% to 0.18%. The rms percent error for sidewall nitride drops from 1.15% to 0.44%.

Figure 17:
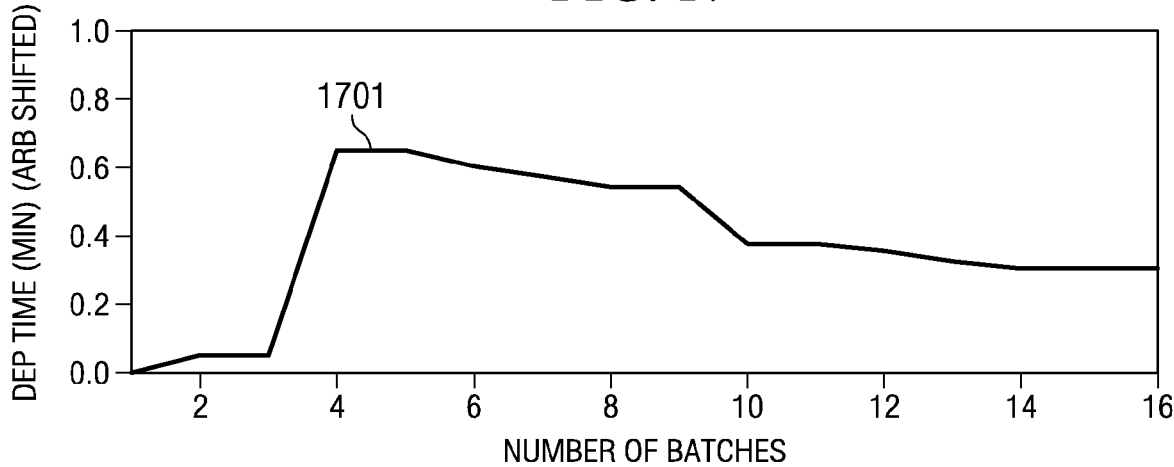
FIG. 17 is a graph illustrating deposition time adjustments for a number of batches in accordance with an aspect of the present invention.
Figure 18:
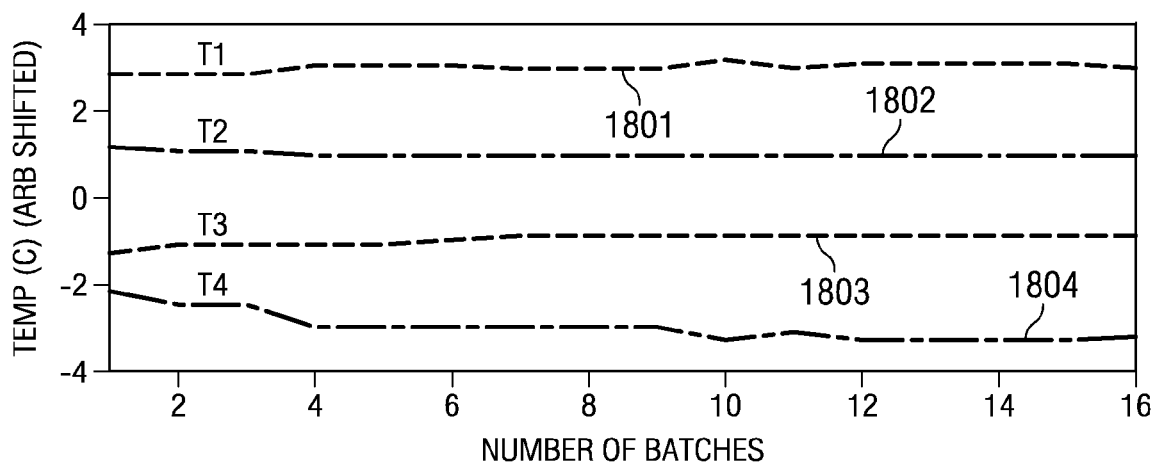
FIG. 18 is a graph illustrating temperature setpoint adjustments for a number of batches in accordance with an aspect of the present invention.

In addition, additional furnace capacity can be obtained due to a drop in furnace idle time while an excursion is detected, and manual adjustments made. FIG. 17 and 18 shows a time and temperature adjustments (all arbitrarily shifted) for isolation nitride on a single furnace. FIG. 17 is a graph illustrating deposition time adjustments for a number of batches in accordance with an aspect of the present invention. An x-axis represents numbers of batches and a y-axis represents adjustments to deposition time using the control mechanism of the present invention. FIG. 18 is a graph illustrating temperature setpoint adjustments for a number of batches in accordance with an aspect of the present invention. An x-axis represents numbers of batches and a y-axis represents adjustments to deposition temperature setpoints using the control mechanism of the present invention. It can be seen that the time compensating for a rate drift across multiple furnace runs, and includes a shift on a furnace liner change, while the temperature changes correct for drifts in specific furnace zones.

The above discussions describe a scheme for control of deposition time and temperature for LPCVD silicon nitride. An analysis of furnace controllability, and the impact of slot selection for measurement (sampling) on process performance were characterized. Stability of the feedback loop to modeling errors while constructing the temperature response model has been quantified. The quantified results are employed to enable the same model to be used across multiple tools, and across different substrates (which impacts the deposition rate). Furthermore, this also bounds the error induced due to sampling. An iterative algorithm was presented for tracking batch data and to update from batch-to-batch.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method for processing semiconductor wafers, comprising:
   providing a multi-zone furnace having a plurality of temperature zones and a central temperature zone;
   loading said semiconductors wafers into said multi zone furnace;
   providing a controller configured to receive a number of thickness measurements obtained directly from said semiconductors wafers in the multi-zone furnace as feedback and iteratively adjust zone temperature setpoints for the plurality of temperature zones and deposition times of the multizone furnace according to a thermal model and the received measurements;
   providing the controller configured to implement the thermal model by providing, for respective temperature zones, an indication of changes in deposition rates as a function of changes in temperature;
   determining an error metric according to the thermal model and the received measurements;
   determining whether the error metric is greater than a dead band value, wherein the dead band value is a selected threshold value;
   determining an excitation value representing whether enough information is available in the received measurements to correctly estimate the thermal model;
   processing said semiconductor wafers; and
   removing said semiconductor wafers from said multi-zone furnace when said processing is complete.

2. The method of claim 1 wherein said processing of said semiconductor wafers comprises a deposition process.

3. A method for processing a semiconductor wafer in a multi-zone furnace, comprising:

providing the multi-zone furnace having a plurality of temperature zones and a central temperature zone;
loading semiconductor wafers in said multi-zone furnace;
performing a deposition process on said semiconductor wafers, said process have a plurality of deposition times;
providing a controller configured to receive a number of thickness measurements from the multi-zone furnace as feedback and iteratively adjusts zone temperature setpoints for the plurality of temperature zones and deposition times of the multizone furnace according to a thermal model and the received measurements;
providing the controller configured to determine whether an error metric according to the thermal model and the received measurements that indicate model error is greater than a dead band value, wherein the dead band value is a selected threshold value;
determining an excitation value representing whether enough information is available in the received measurements to correctly estimate the thermal model; and
removing said semiconductor wafers from said multi-zone furnace when said deposition process is complete.

4. The method of claim 3, the controller configured to apply the thermal model based upon deposition rates for the plurality of zones according to deviations in temperature from the central temperature zone.

5. The method of claim 3, the controller configured to control pressure of the multi-zone furnace and gas flow into the furnace of a deposition material source.

6. The method of claim 3, further comprising configuring a metrology tool to provide deposition process parameters to the controller, configuring the controller to initially set the zone temperature setpoints for the plurality of temperature zones and the central temperature zone at least in part according to the provided deposition process parameters.

7. The method of claim 3 wherein the deposition process parameters including one or more target thicknesses.

8. The method of claim 3 wherein the multi-zone furnace including a number of slots throughout the plurality of temperature zones and the central temperature zone and said slots are filled with said semiconductor wafers.

9. The method of claim 3, further comprising configuring probes to obtain the thickness measurements from selected semiconductor wafers and provide the thickness measurements to the controller.

10. The method of claim 3 further comprising configuring the controller to determine the error metric according to sub-sampling error and adjusts the zone temperature setpoints on the error metric to be above the dead band value.

11. The method of claim 3 further comprising configuring the controller to build the thermal model of deposition rates for the plurality of zones from thickness measurements.

12. The method of claim 3 further comprising configuring the controller to determine an excitation value according to the thickness measurements that indicates presence of information available in the thickness measurements.

13. The method of claim 3 further comprising configuring the controller to determine the excitation value by tracking changes in processes performed by the furnace.

* * * * *